(12) United States Patent
Jang et al.

(10) Patent No.: US 11,170,492 B2
(45) Date of Patent: Nov. 9, 2021

(54) METHODS AND DEVICES OF PERFORMING STRUCTURE OPERATION BASED ON BOUNDARY SURFACE STRUCTURE

(71) Applicant: SAMSUNG ELECTRONICS CO., LTD., Suwon-si (KR)

(72) Inventors: Sunghwan Jang, Suwon-si (KR); Jinha Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 54 days.

(21) Appl. No.: 16/701,993

(22) Filed: Dec. 3, 2019

(65) Prior Publication Data
US 2020/0357110 A1    Nov. 12, 2020

(30) Foreign Application Priority Data
May 7, 2019 (KR) .......................... 10-2019-0052713

(51) Int. Cl.
| | | |
|---|---|---|
| *G06T 7/60* | (2017.01) | |
| *G06T 17/20* | (2006.01) | |
| *G06T 7/00* | (2017.01) | |

(52) U.S. Cl.
CPC .............. *G06T 7/0004* (2013.01); *G06T 7/60* (2013.01); *G06T 17/20* (2013.01)

(58) Field of Classification Search
None
See application file for complete search history.

(56) References Cited

U.S. PATENT DOCUMENTS

| | | |
|---|---|---|
| 5,677,846 A | 10/1997 | Kumashiro |
| 9,916,663 B2 | 3/2018 | Kawamoto |
| 2008/0246766 A1 | 10/2008 | Yokohari et al. |
| 2011/0032370 A1* | 2/2011 | Ludwig ................. H04N 5/225 348/218.1 |
| 2017/0052152 A1 | 2/2017 | Tat et al. |
| 2018/0158241 A1 | 6/2018 | Lee et al. |
| 2020/0134773 A1* | 4/2020 | Pinter .................... G06T 7/521 |

FOREIGN PATENT DOCUMENTS

| | | |
|---|---|---|
| JP | 2000-0331063 A | 11/2000 |
| JP | 4650000 B2 | 3/2011 |

* cited by examiner

*Primary Examiner* — Idowu O Osifade
(74) *Attorney, Agent, or Firm* — Lee IP Law, PC

(57) ABSTRACT

A method of performing a structure data operation includes providing input data including a processing structure and an input solid structure including a plurality of solid units, converting the input solid structure to an input boundary surface structure including attribute information on input boundary surfaces of the plurality of solid units, performing a structure data operation on the input boundary surface structure to generate an output boundary surface structure, and providing output data based on the output boundary surface structure. The structure data operation includes applying the processing structure to the input boundary surface structure.

20 Claims, 39 Drawing Sheets

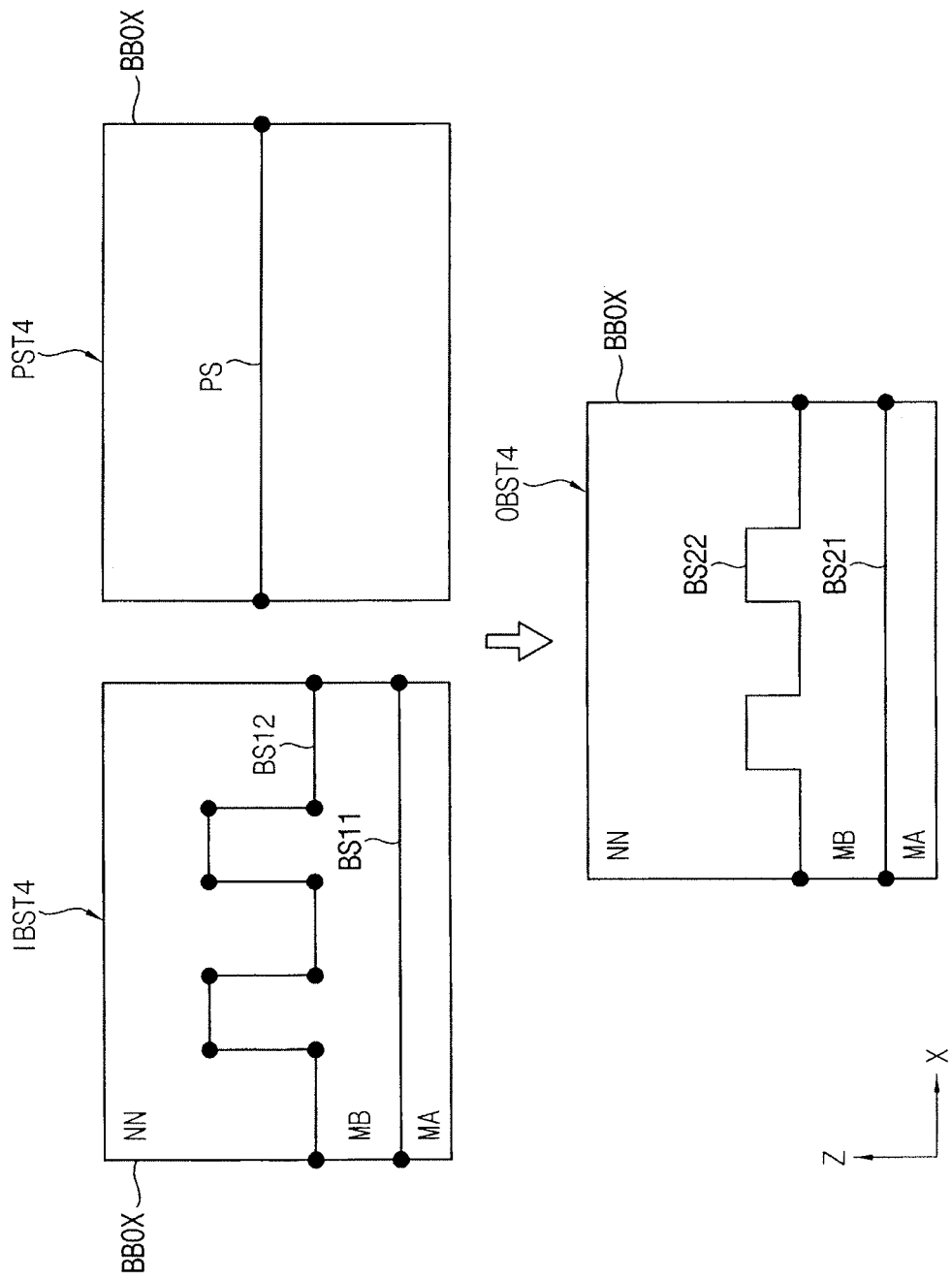

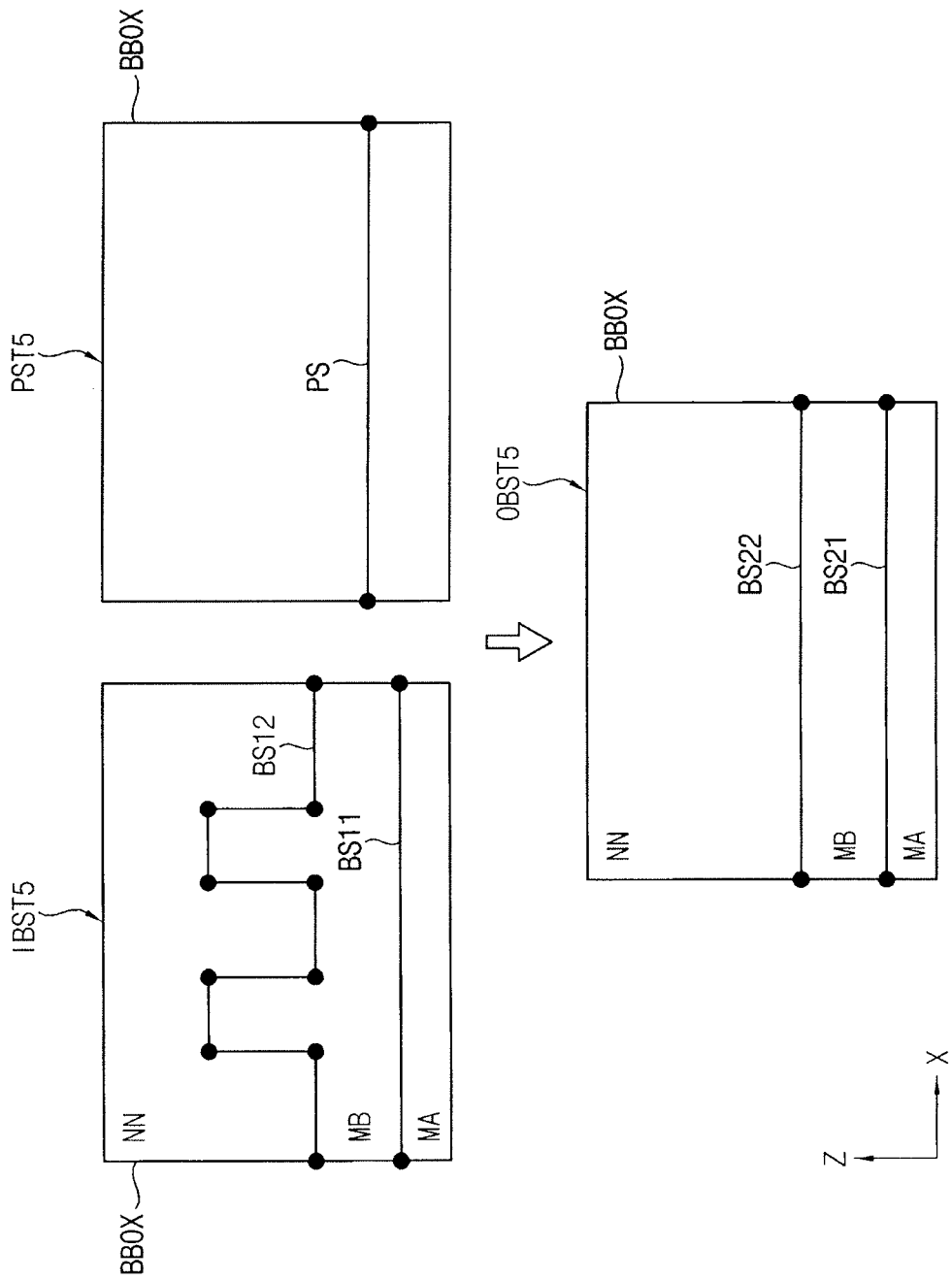

METHODS AND DEVICES OF PERFORMING STRUCTURE OPERATION BASED ON BOUNDARY SURFACE STRUCTURE

CROSS-REFERENCE TO RELATED APPLICATION

Korean Patent Application No. 10-2019-0052713, filed on May 7, 2019, in the Korean Intellectual Property Office, and entitled: "Methods and Devices of Performing Structure Data Operation Based on Boundary Surface Structure," is incorporated by reference herein in its entirety.

BACKGROUND

1. Field

Example embodiments relate to data processing, and more particularly to methods and devices of performing structure data operation based on boundary surface structure.

2. Description of the Related Art

Data including a three-dimensional structure may include noise. The noise may include structure noise or error from original structure data. In particular, the structure noise may not be removed easily so that the removal of the structure noise may significantly increase processing time or processing amounts.

SUMMARY

Embodiments are directed to a method of performing a structure data operation includes providing input data including a processing structure and an input solid structure including a plurality of solid units: converting the input solid structure to an input boundary surface structure including attribute information on input boundary surfaces of the plurality of solid units; performing a structure data operation on the input boundary surface structure to generate an output boundary surface structure, the structure data operation includes applying the processing structure to the input boundary surface structure; and providing output data based on the output boundary surface structure.

Embodiments are directed to a device of performing a structure data operation. The device may include a structure converter to convert an input solid structure including a plurality of solid units to an input boundary surface structure including attribute information on input boundary surfaces of the plurality of solid units; and an operator to perform a structure data operation to generate an output boundary surface structure, the structure data operation including applying a processing structure to the input boundary surface structure.

Embodiments are directed to a computer-based electronic system. The computer-based electronic system may include an input device to receive input data including a processing structure and an input solid structure including a plurality of solid units, a memory device to store information including program routines, the program routines to convert the input solid structure to an input boundary surface structure including attribute information on input boundary surfaces of the plurality of solid units and perform a structure data operation to generate an output boundary surface structure, the structure data operation including applying the processing structure to the input boundary surface structure; an output device to display the input solid structure and an output solid structure corresponding to the output boundary surface structure; and a processor connected to the input device, the output device and the memory device, the processor to control the program routines.

BRIEF DESCRIPTION OF THE DRAWINGS

Features will become apparent to those of skill in the art by describing in detail exemplary embodiments with reference to the attached drawings in which:

FIGS. 23A and 23B illustrate examples for describing a planarization operation method according to example embodiments.

DETAILED DESCRIPTION

Figure 1:
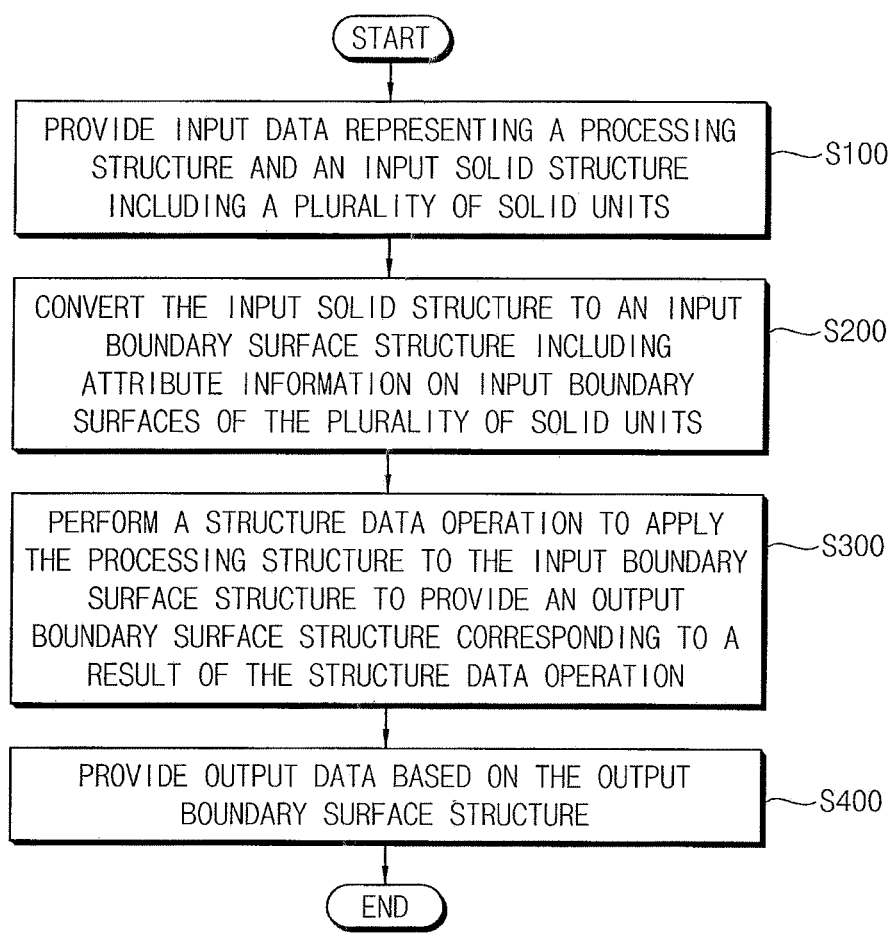
FIG. 1 illustrates a flow chart of a structure data operation method according to example embodiments.

Various example embodiments will be described more fully hereinafter with reference to the accompanying drawings, in which some example embodiments are shown. In the drawings, like numerals refer to like elements throughout.

FIG. 1 illustrates a flow chart of a structure data operation method according to example embodiments. Referring to FIG. 1, input data including information of a processing structure and an input solid structure may be provided (S100). For example, the processing structure may include a layer structure of a device. The input solid structure may include a plurality of solid layers of the device. The processing structure and the input solid structure may be a three-dimensional structure including various polyhedrons. The three-dimensional structure may include elements of vertexes, edges, faces and solid units of the polyhedrons. The processing structure may include an etching surface for an etching process, a planarization surface for a planarization process, a deposition surface for a deposition process, a filling surface for a filling process, and so on.

The input data, including the information of, e.g., the input solid structure and the processing structure, may be provided through various methods. In some example embodiments, the input data may be generated by an electronic design automation (EDA) tool. In other example embodiments, the input data may be provided by processing image data that are captured by an image sensor. In still other example embodiments, the input data may be provided by restructuring data that are generated by a computer vision. Further, the input data may be provided through other various methods.

For example, the input solid structure may be converted to an input boundary surface structure including attribute information on input boundary surfaces of the plurality of solid units (S200). For example, the input solid structure may include information of, e.g., polyhedrons. The input boundary surface structure may include information of, e.g., boundary surfaces of the polyhedrons. The input solid structure and the input boundary surface structure will be described below with reference to FIGS. 3 and 4.

For example, a structure data operation may be performed to apply the processing structure to the input boundary surface structure such that an output boundary surface structure corresponding to a result of the structure data operation is generated (S300). For example, output data may be provided based on the output boundary surface structure (S400).

For example, as the input boundary surface structure includes the attribute information on the input boundary surfaces, the output boundary surface structure may include attribute information on output boundary surfaces. In some example embodiments, the output data may correspond to the output boundary surface structure. In other example embodiments, the output boundary surface structure may be converted to an output solid structure, and the output data may correspond to the output solid structure.

For example, the structure data operation method according to example embodiments may reduce, e.g., data processing time and data processing amounts by simplifying the structure data operation between the solid units through using the boundary surface structures. Further, noise and errors in a three-dimensional structure may be reduced through the simplified structure data operation.

Figure 2:
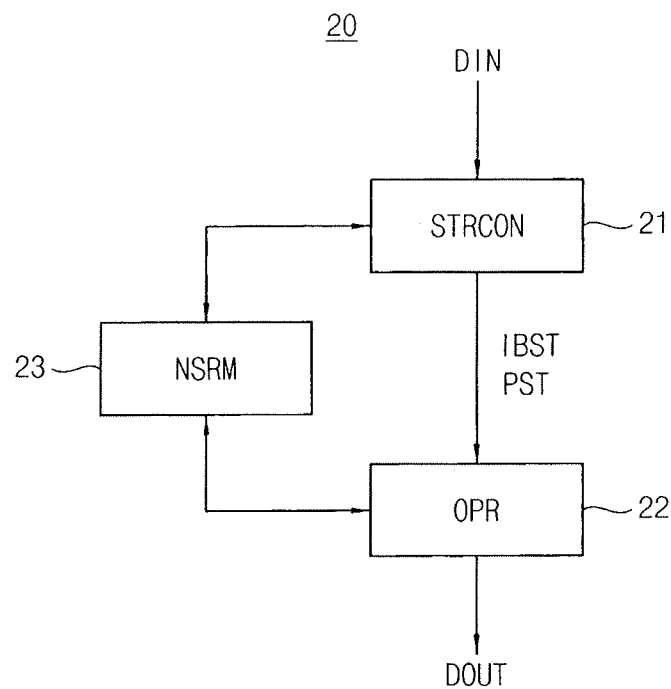
FIG. 2 illustrates a structure data operation device according to example embodiments.

FIG. 2 illustrates a structure data operation device according to example embodiments. Referring to FIG. 2, a structure data operation device 20 may include a structure converter STRCON 21, an operator OPR 22 and a noise remover NSRM 23.

The structure converter 21 may receive input data DIN including an input solid structure and convert the input solid structure including a plurality of solid units to an input boundary surface structure IBST including attribute information on input boundary surfaces of the plurality of solid units. In some example embodiments, the structure converter 21 may receive an input processing structure that is included in the input data DIN and is based the input solid structure and may convert the input processing structure to a processing structure PST that is based on the boundary surface structure.

The operator 22 may perform a structure data operation to apply the processing structure PST to the input boundary surface structure IBST such that an output boundary surface structure corresponding to a result of the structure data operation is generated. In some example embodiments, the operator 22 may generate output data DOUT corresponding to the output boundary surface structure. In other example embodiments, the operator 22 may convert the output boundary surface structure to an output solid structure, and generate the output data DOUT corresponding to the output solid structure.

The noise remover 23 may reduce, e.g., structure noise or structure defects. For example, the structure noise or structure defects may be caused in the input data DIN, the output data DOUT and/or data generated during the structure data operation.

In some example embodiments, the noise remover 23 may perform a smoothing data operation with respect to received data based on boundary conditions to provide data including a structure in which the noise of the received data is reduced or removed. For example, the noise remover 23 may receive data including boundary surface structure from the structure converter 21 or the operator 22 and may perform the smoothing data operation on the data including the boundary surface structure to reduce or remove the noise thereof. The function of the noise remover 23 may be implemented in various ways. For example, the smoothing data operation by the noise remover 23 may be performed by a restructuring method including a surface energy minimization. Examples of the smoothing data operation will be described below with reference to FIGS. 33 through 36.

In example embodiments, the structure data operation device 20 and the structure data operation method may be implemented with hardware, software or a combination of hardware and software. For example, the structure data operation device 20 and the structure data operation method may be implemented in a computer program product embodied in one or more computer readable medium(s) having computer readable program code embodied thereon. The computer readable program code may be provided to a processor of, e.g., a typical computer, a specific computer, or other programmable data processing apparatuses. The computer readable medium may be a computer readable signal medium or a computer readable storage medium. The computer readable storage medium may be a tangible medium that is able to contain or store a program for use by or in connection with an instruction execution system, apparatus, or device.

Figure 3:
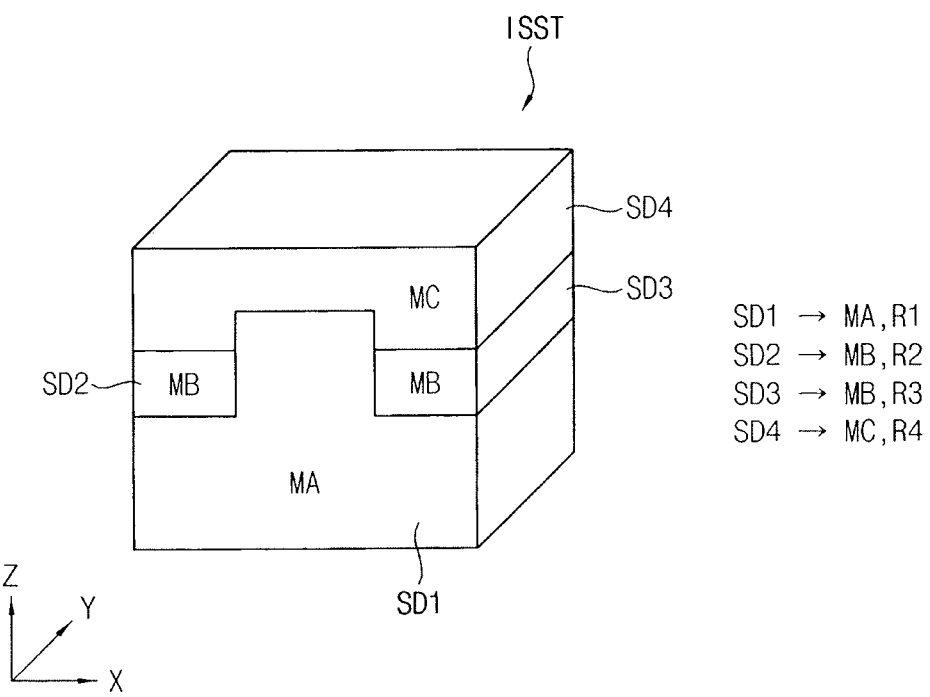
FIG. 3 illustrates an example of a solid structure.

FIG. 3 illustrates an example of a solid structure. Referring to FIG. 3, an input solid structure ISST may include attribute information on a plurality of solid units SD1~SD4. The attribute information of the plurality of solid units SD1~SD4 may include e.g., materials MA, MB, MC, and NN thereof. Further, region identifiers R1~R4 may be allocated to each of the plurality of solid units SD1~SD4. In other words, structure elements (e.g., vertexes, edges, faces and solid units) in the input solid structure ISST may be grouped with respect to each solid unit. The attribute information of the plurality of solid units SD1~SD4 may be allocated to the structure elements included in each group. In FIG. 3, the material MA may indicate a first material, the material MB may indicate a second material, the material MC may indicate a third material, and the notation NN may indicate a void space without materials.

Figure 4:
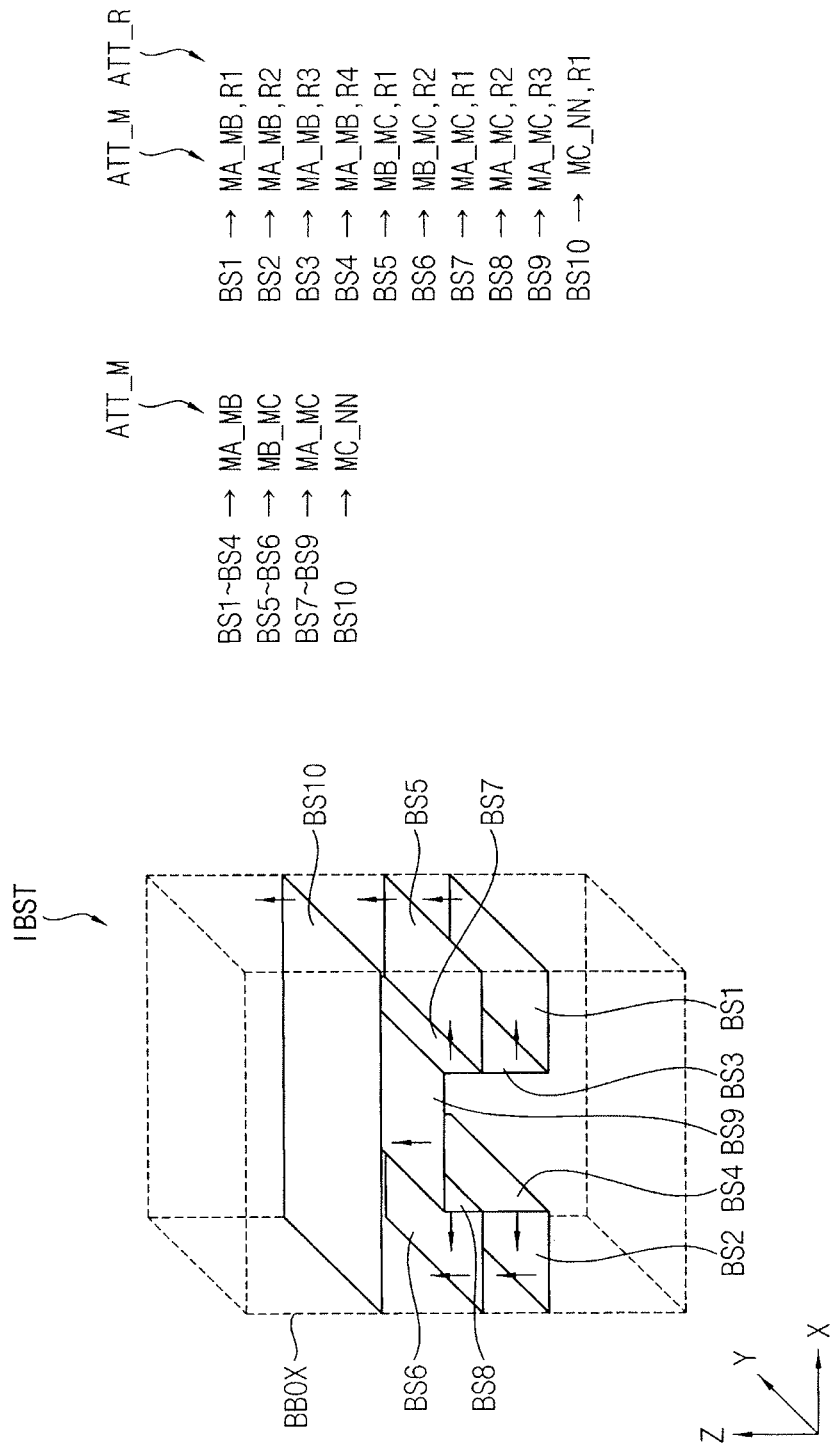
FIG. 4 illustrates a boundary surface structure according to example embodiments.

FIG. 4 illustrates a boundary surface structure according to example embodiments. FIG. 4 illustrates an input boundary surface structure IBST that is converted from the input solid structure ISST in FIG. 3. Referring to FIG. 4, the input boundary surface structure IBST for performing a structure data operation may be included in a bounding box that defines a volume unit for performing the structure data operation among the input solid structure.

In some example embodiments, the input solid structure ISST may be converted to the input boundary surface structure IBST by allocating material attribute ATT_M to each of the input boundary surfaces BS1~BS10 such that the material attribute ATT_M indicates two solid units or materials of the solid units at both sides of each of the input boundary surfaces BS1~BS10. In the material attribute ATT_M, the notation NN may indicate a void space without materials. A plurality of arrows in FIG. 4 may indicate normal vectors of the input boundary surfaces. The notation MA_MB may be related to the direction of the normal vector such that a positive direction of the normal vector may be a direction from the first material MA to the second material MB.

In some example embodiments, with respect to each of the boundary surfaces BS1~BS10, region attribute ATT_R may be allocated in addition to the material attribute ATT_M. For example, the input boundary surface with the same material attribute ATT_M may be divided into sub input boundary surfaces. The region attribute ATT_R may be allocated to identify each of the sub input boundary surfaces. In an example embodiment, referring to FIG. 4, the four input boundary surfaces BS1~BS4 may be considered as one input boundary surface because the four input boundary surfaces BS1~BS4 have the same material attribute MA_MB. In other words, the one input boundary surface may be divided into the four sub input boundary surfaces BS1~BS4, and different region attribute R1~R4 may be allocated to the four sub input boundary surfaces BS1~BS4, respectively.

In the input boundary surface structure IBST, the structure elements may be grouped with respect to each of the input boundary surfaces BS1~BS10, and the same attribute information may be allocated to the structure elements included in each group.

Figure 5:
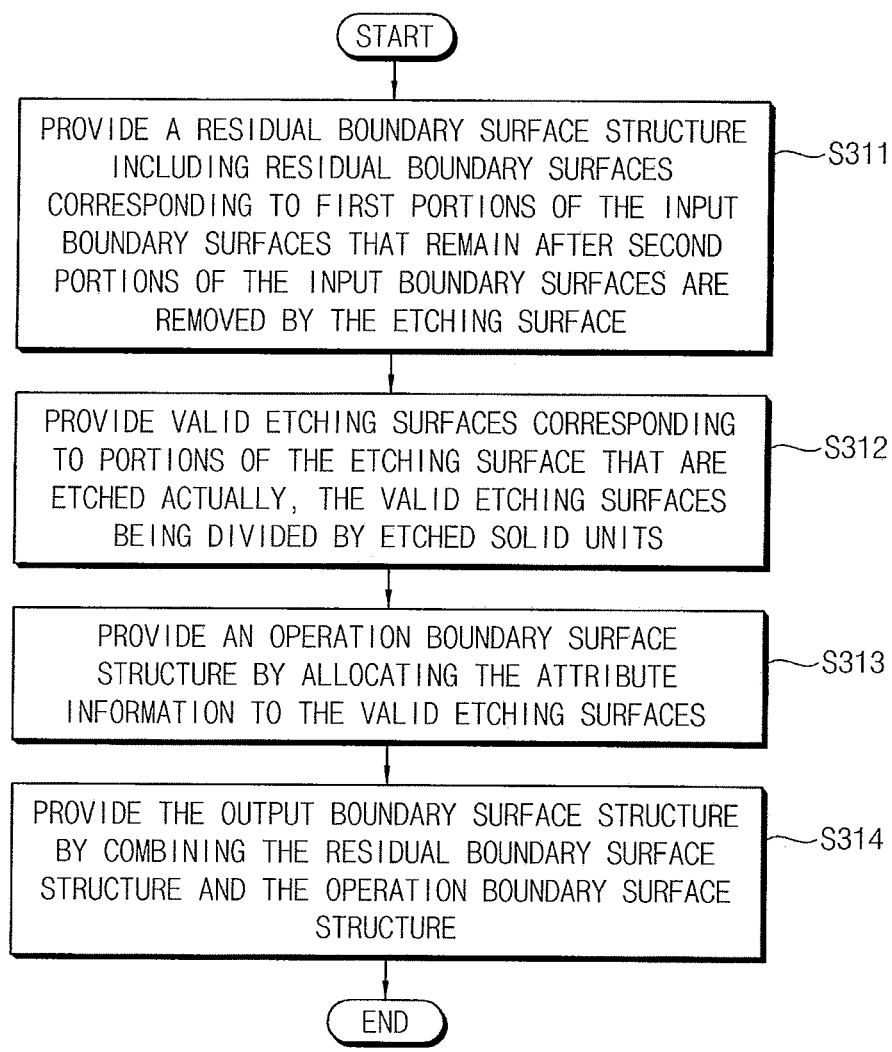
FIG. 5 illustrates a flow chart of an etching operation method according to example embodiments.

FIG. 5 illustrates a flow chart of an etching data operation method according to example embodiments. FIG. 5 illustrates an etching data operation method that the processing structure corresponds to an etching surface, and the structure data operation corresponds to an etching process to remove materials of the input solid structure according to the etching surface.

Referring to FIG. 5, a residual boundary surface structure may include residual boundary surfaces corresponding to first portions of the input boundary surfaces that remain after second portions of the input boundary surfaces are removed according to the etching surface (S311). For example, valid etching surfaces may be provided, may correspond to portions of the etching surface that are etched actually, and may be divided by etched solid units (S312). An operation boundary surface structure may be provided by allocating the attribute information to the valid etching surfaces (S313). The output boundary surface structure may be provided by combining the residual boundary surface structure and the operation boundary surface structure (S314).

Figure 6A:
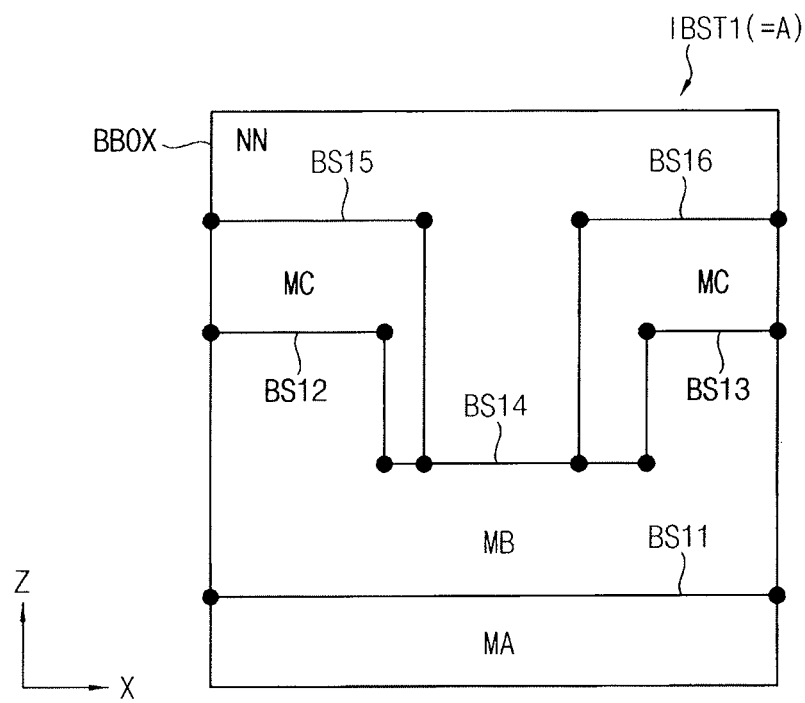
FIGS. 6A, 6B and 6C illustrate an example of an input boundary surface structure and a processing structure.

The etching data operation method in FIG. 5 will be further described below with reference to FIGS. 6A through 22. Hereinafter, for convenience of illustration and description, the three-dimensional structure is described using cross-sectional views. For example, FIG. 6A illustrates a cross-section view by cutting a three-dimensional structure with a plane parallel to an XZ-plane. For example, the three-dimensional structure may be identical along a Y-direction. Accordingly, a plurality of dots in FIG. 6A may indicate lines extending in the Y-direction, and the lines in FIG. 6A may indicate planes extending in the Y-direction.

Figure 6B:
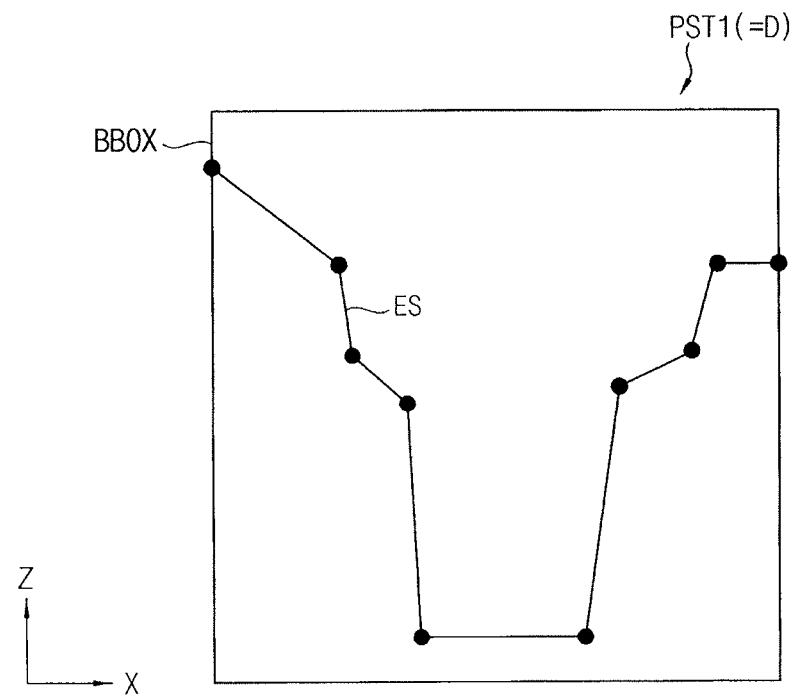
Figure 6C:
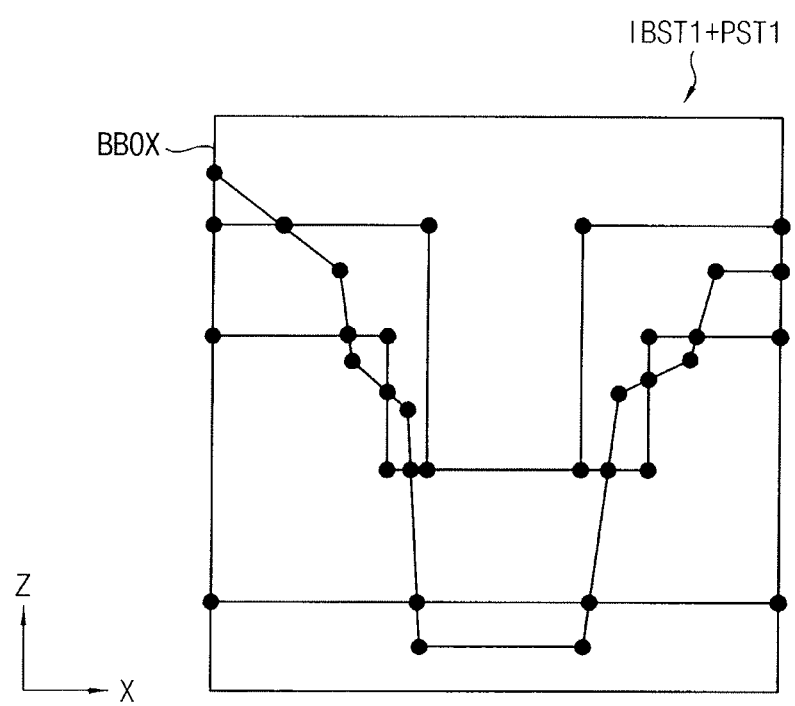

FIGS. 6A, 6B and 6C illustrate an example of an input boundary surface structure and a processing structure. FIG. 6A illustrates an example of an input boundary surface structure IBST1, FIG. 6B illustrates an example of a processing structure PST1, and FIG. 6C illustrates a combined boundary surface structure IBST1+PST1 that is generated by combining the input boundary surface structure IBST1 and the processing structure PST1.

Referring to FIG. 6A, the input boundary surface structure IBST1 may include first through sixth input boundary surfaces BS11~BS16. The input boundary surface structure IBST1 may be an A type structure. For example, attribute information of the first through sixth input boundary surfaces BS11~BS16 may include material attribute indicating two solid units or materials of the solid units at both sides of each of the input boundary surfaces BS11~BS16. The input boundary surface structure IBST1 may be represented using the material attribute as follows.

BS11→MA_MB
BS12, BS13→MB_MC
BS14→MB_NN
BS15, BS16→MC_NN

Referring to FIG. 6B, a processing structure PST1 may include an etching surface ES. The etching surface ES in FIG. 6B may correspond to a D type structure as will be described below with reference to FIG. 8. For example, an output boundary surface structure may be generated based on the input boundary surface structure and the IBST1 and the processing structure PST1. The output boundary surface structure may correspond to a result of a structure data operation that is performed by applying the processing structure PST1 to the input boundary surface structure IBST1. For example, the structure data operation corresponding to an etching process may be performed, and the output boundary surface structure after performing the etching process on the input boundary surface structure IBST1 using the etching surface ES may be provided. For example, the input boundary surface structure IBST1 may include the first through sixth input boundary surfaces BS11~BS16 that are generated by converting an input solid structure. The processing structure PST1 may include the etching surface ES for an etching process on the input solid structure. Further, the combined boundary surface structure IBST1+PST1 may include the first through sixth input boundary surfaces BS11~BS16 and the etching surface ES.

Figure 7A:
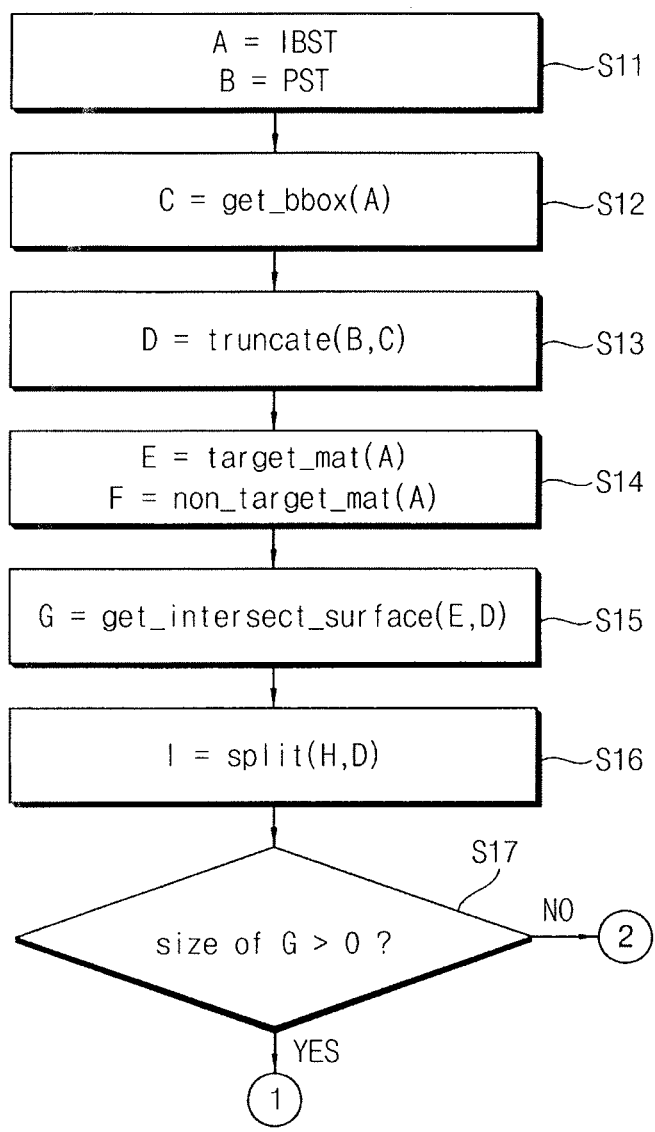
FIGS. 7A, 7B and 7C illustrate flow charts of an etching operation method according to example embodiments.
Figure 7B:
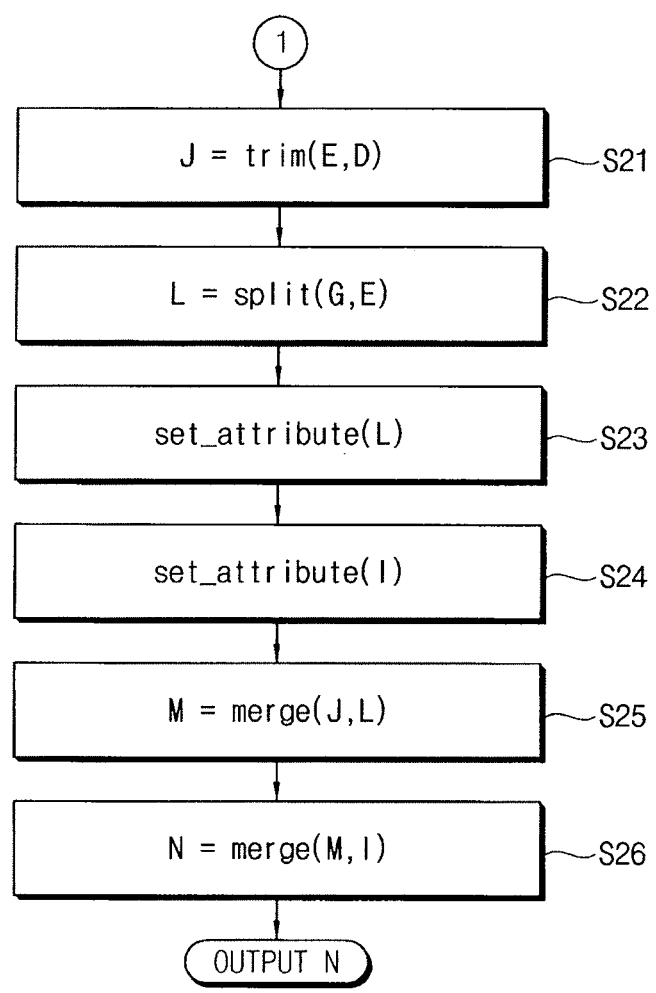
Figure 7C:
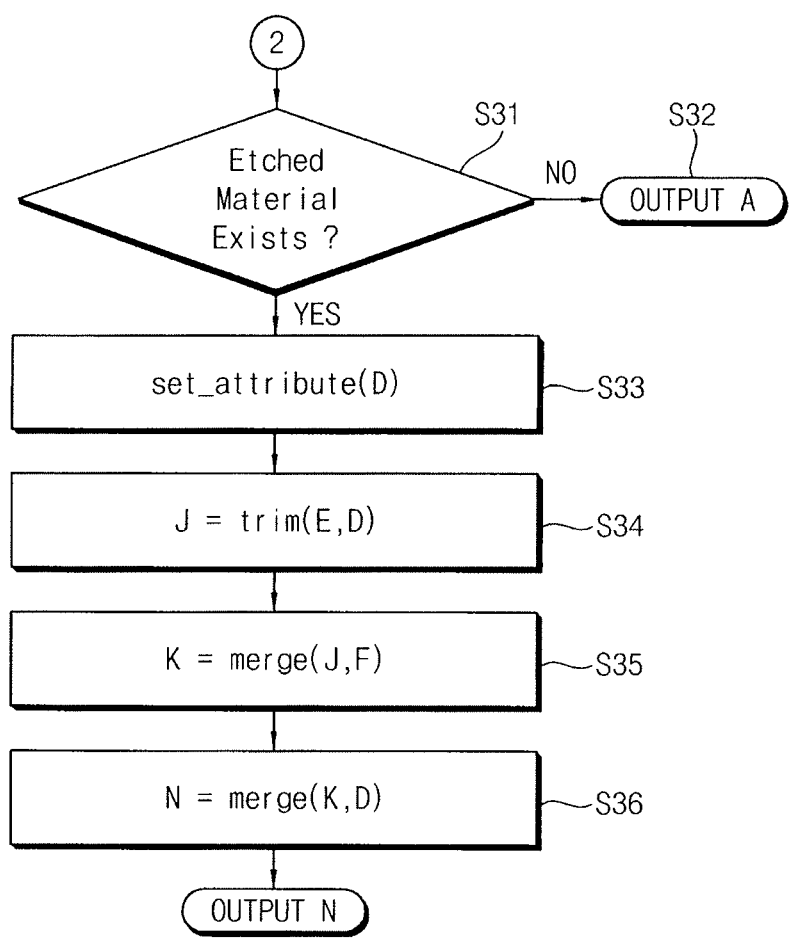

FIGS. 7A, 7B and 7C illustrate flow charts of an etching data operation method according to example embodiments, FIGS. 8 through 16 and 18A through 22 illustrate diagrams for describing an etching data operation method according to example embodiments. FIGS. 17A and 17B illustrate diagrams for matching of boundary lines of an output boundary surface structure according to example embodiments.

Referring to FIG. 7A, an input boundary surface structure IBST may be received and set as an A type structure, and a processing structure PST may be received and set as a B type structure (S11). Further, a C type structure may be set to define a volume unit for performing the structure data operation among the input solid structure. For example, the C type structure may indicate bounding box BBOX including the A type structure and may be expressed as C=get_bbox(A) (S12). The B type structure may be cut by the C type structure, and a D type structure may be expressed as D=truncate(B,C) (S13).

Figure 8:
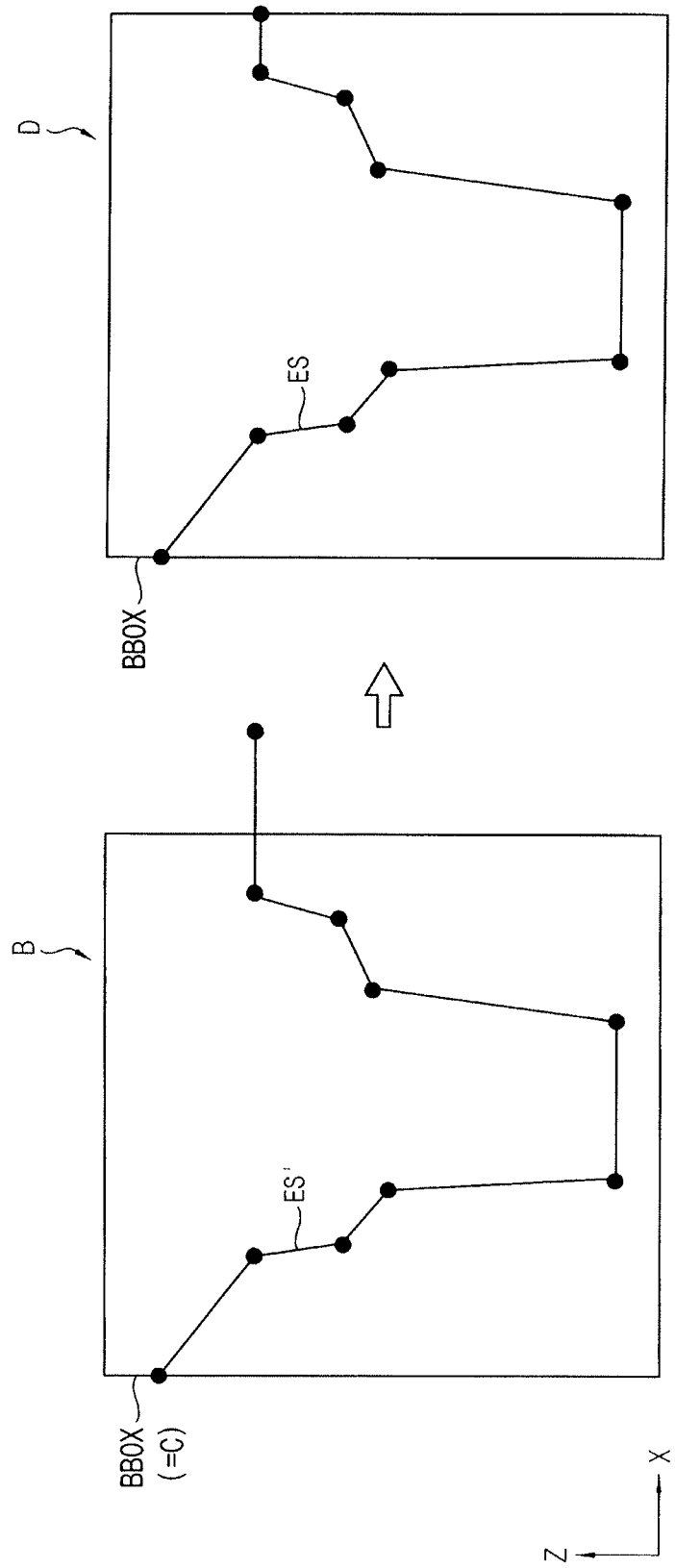
FIGS. 8 through 16 illustrate examples for describing an etching operation method according to example embodiments.

For example, regarding the input boundary surface structure IBST1 in FIG. 6A, the B type structure may be cut by the C type structure to generate the D type structure in FIG. 8. For example, a portion of the etching surface ES' of the B type structure may be cut by the bounding box BBOX and the D type structure may correspond to the processing structure PST1 in FIG. 6B. An entire input structure may be partitioned by a plurality of bounding boxes. The structure data operations may be performed according to each of the plurality of bounding boxes. Results of the structure data operations corresponding to the plurality of bounding boxes may be combined. An entire output structure corresponding to the entire input structure may be generated.

According to example embodiments, the input boundary surfaces may be classified as an etching permission input boundary surface that is etched by an etching process or an etching inhibition input boundary surface that is not etched by the etching process. The etching permission input boundary surface may be expressed as E=target_mat(A), and the etching inhibition input boundary surface may be expressed as F=non_target_mat(A) (S14).

Figure 9:
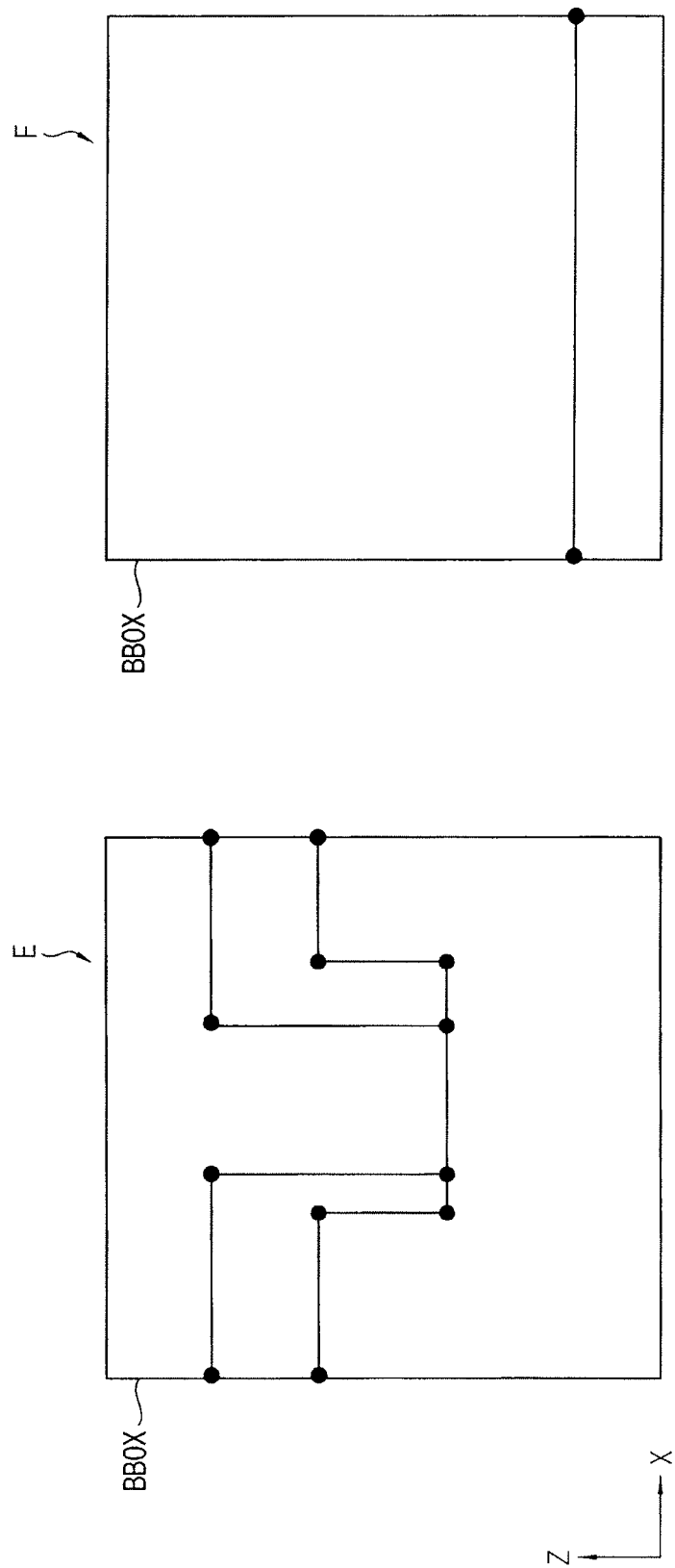

According to an example embodiment For example, when the A type structure corresponds to the input boundary surface structure IBST1 in FIG. 6A and the D type structure corresponds to the processing structure PST1 in FIG. 6B, an E type structure including the etching permission input boundary surface and a F type structure including the etching inhibition input boundary surface are illustrated in FIG. 9. Further, in the E type structure and the F type structure in FIG. 9, the first material MA may be a material that may not be etched and the second and third materials MB and MC may be materials that may be etched.

Further, valid etching surfaces may be provided and expressed as G=get_intersect_surface(E,D) (S15). For example, the valid etching surfaces may be generated by removing an invalid etching surface from the etching surface ES. The invalid etching surface may correspond to a portion of the etching surface ES that is disposed under an etching inhibition cross surface corresponding to a portion of the etching inhibition input boundary surface that is divided by the etching surface ES.

Figure 10:
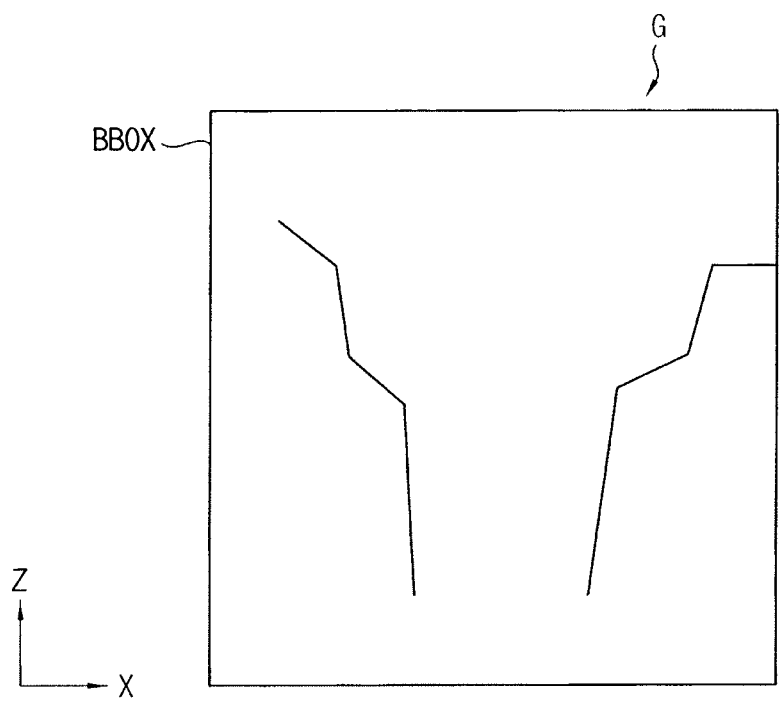
Figure 11:
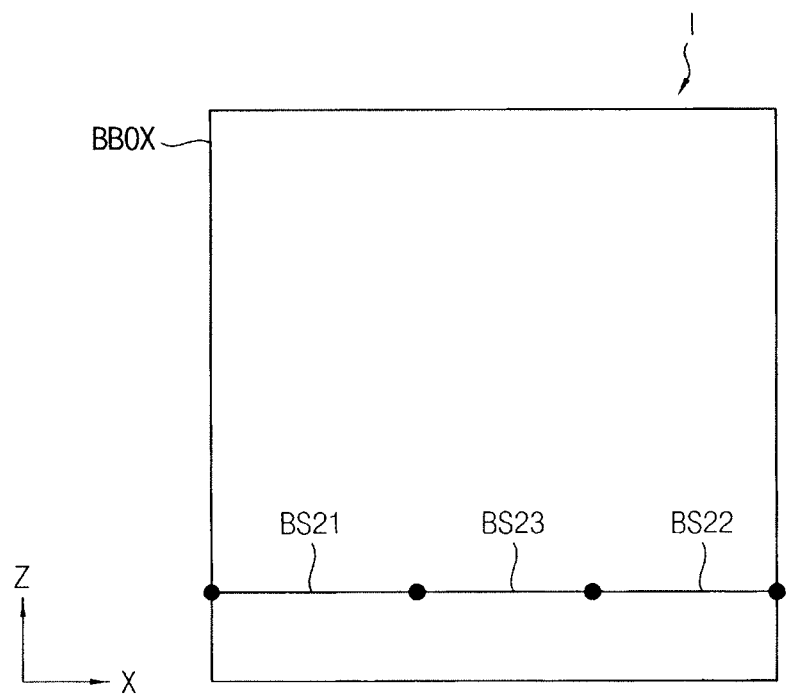

With respect to the D type structure in FIG. 8 and the E type structure in FIG. 9, FIG. 10 illustrates a G type structure including the valid etching surfaces that correspond to portions that are etched. For example, the etching inhibition input boundary surface may be divided based on cross lines of the etching inhibition input boundary surface of the F type structure and the etching surface ES of the D type structure. The etching inhibition input boundary surface may be expressed as I=split(H,D) (S16). Further, an etching inhibition cross surface may be provided and may correspond to a portion of the etching inhibition input boundary surface that is divided by the etching surface ES. FIG. 11 illustrates an I type structure including the etching inhibition input boundary surface that is divided by cross lines (represented by the dots). For example, the etching inhibition cross surface may correspond to a middle portion BS23 of the etching inhibition input boundary surface BS21, BS22 and BS23.

Further, it may be determined whether a size of the G type structure including the valid etching surfaces (e.g., a size of the valid etching surfaces) is greater than zero (S17). FIG. 7B illustrates processes when the size of the valid etching surfaces is greater than zero, e.g., when the valid etching surfaces exist (S17: YES). FIG. 7C illustrates processes when the size of the valid etching surfaces is not greater than zero, e.g., when the valid etching surfaces do not exist (S17: NO).

Figure 12:
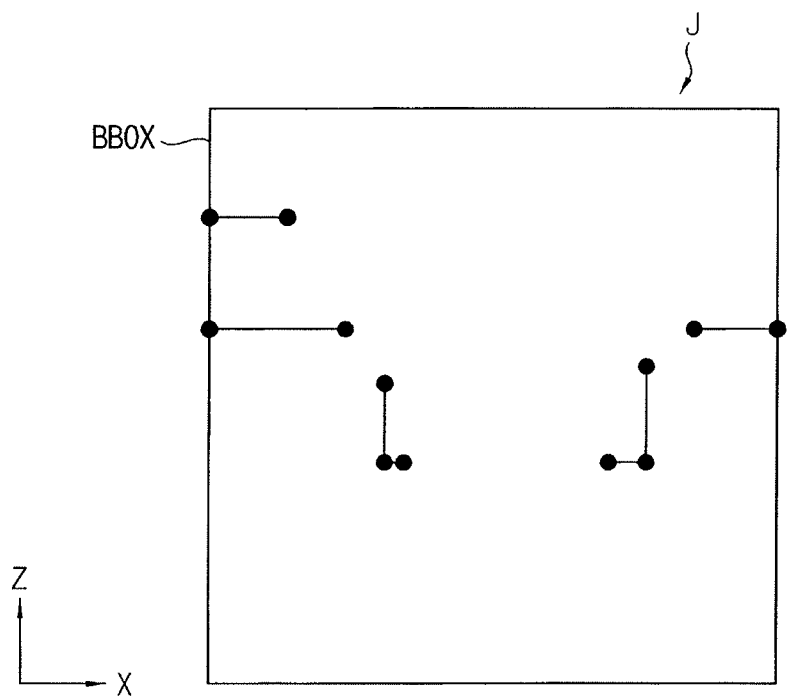

Referring to FIG. 7B, a residual boundary surface structure may be provided and include residual boundary surfaces corresponding to first portions of the input boundary surfaces that remain after second portions of the input boundary surfaces are removed according to the etching surface. The residual boundary surface structure may be expressed as J=trim(E,D) (S21). FIG. 12 illustrates a J type structure including the residual boundary surfaces that remain after the etching permission input boundary surface in the E type structure in FIG. 9 is etched by the etching surface ES in the D type structure in FIG. 8.

Figure 13:
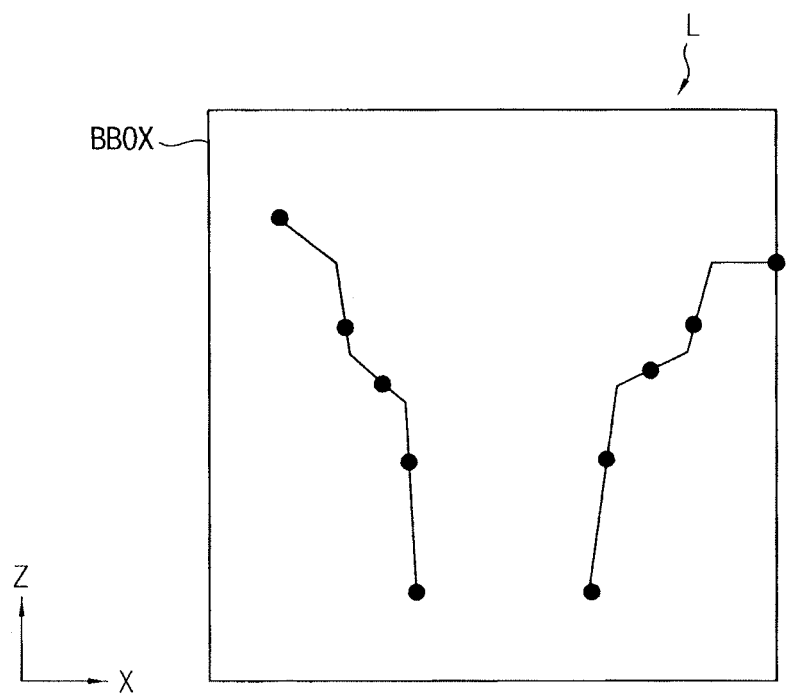

Referring to FIG. 7B, removed portions of the etching surface that are etched may be divided based on the etched solid units or materials. FIG. 13 illustrates an L type structure of the valid etching surfaces of the G type structure in FIG. 10 that is expressed as L=split(G,E) (S22). Further, the L type structure in FIG. 3 may be generated by dividing the valid etching surfaces of the G type structure in FIG. 10 based on the E type structure in FIG. 9 including the etching permission input boundary surfaces.

Referring to FIG. 7B, an operation boundary surface structure may be provided by allocating the attribute information to the divided valid etching surfaces (set_attribute (L))(S23). The attribute information may be allocated to the divided etching inhibition cross surface (set_attribute(I)) (S24). Thus, the boundary surface structure for the entire etching inhibition cross surface may be determined. For example, among the etching inhibition input boundary surfaces (e.g., BS21, BS22, and BS23 in FIG. 11), the attribute information of the etching inhibition cross surface (e.g., BS23 in FIG. 11) may be updated, and the attribute information of the other portions (e.g., BS21 and BS22 in FIG. 11) may be maintained.

Figure 14:
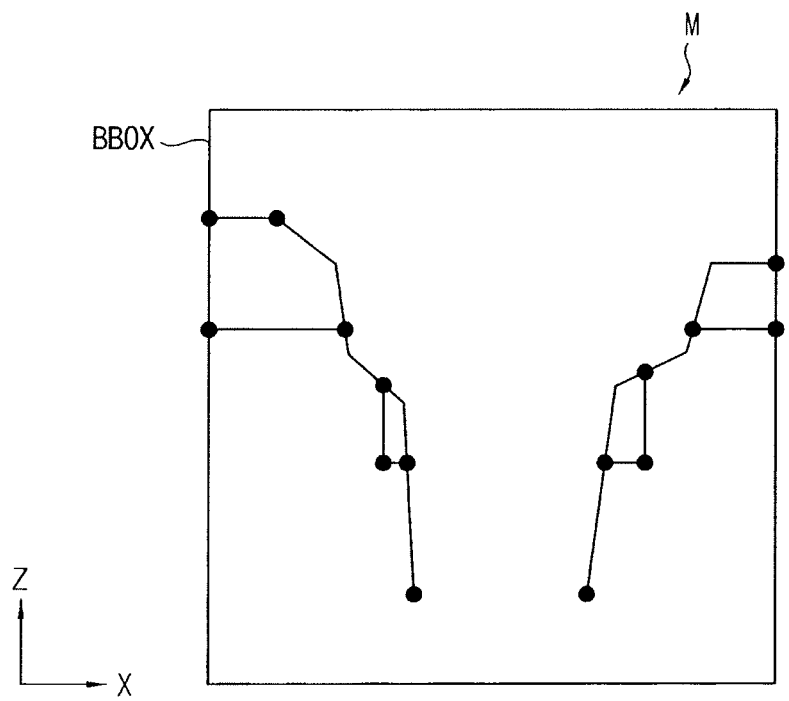

After the attribute information is allocated to the divided valid etching surfaces, the residual boundary surface structure and the operation boundary surface structure may be combined to generate an M type structure (M=merge(J,L)) (S25). According to an example embodiment, FIG. 14 illustrates the M type structure that is a combination of the J type structure in FIG. 12 including the residual boundary surface structure and the I type structure in FIG. 11 including the etching inhibition input boundary surfaces.

Figure 15:
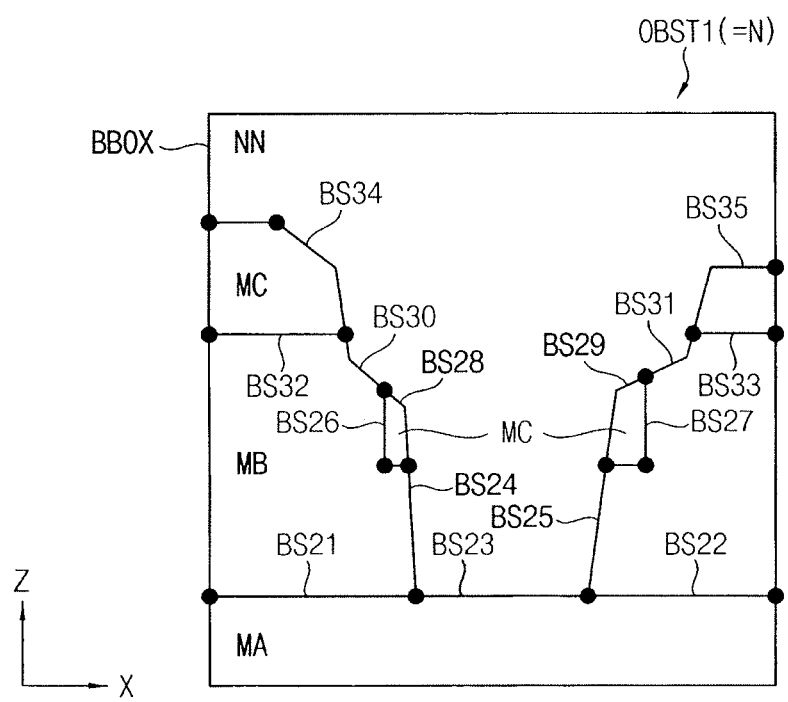

In addition, the etching inhibition input boundary surfaces, to which the attribute information is allocated, may be combined to generate a combined structure, e.g., a N type structure (N=merge(M,I))(S26). FIG. 15 illustrates the N type structure that is a combination of the M type structure in FIG. 14 and the I type structure in FIG. 13 including the valid etching surfaces.

For example, the combined structure may be provided as the output boundary surface structure. The N type structure in FIG. 15 may correspond to an output boundary surface structure OBST1 corresponding to the input boundary surface structure IBST1 in FIG. 6A and the processing structure PST1 in FIG. 6B. The output boundary surface structure OBST1 including the output boundary surfaces BS21~BS35 may be represented using material attribute as follows.

BS21, BS22→MA_MB
BS23→MA_NN
BS24, BS25, BS30, BS31→MB_NN

BS26, BS27, BS32, BS33→MB_MC
BS28, BS29, BS34, BS35→MC_NN

Figure 16:
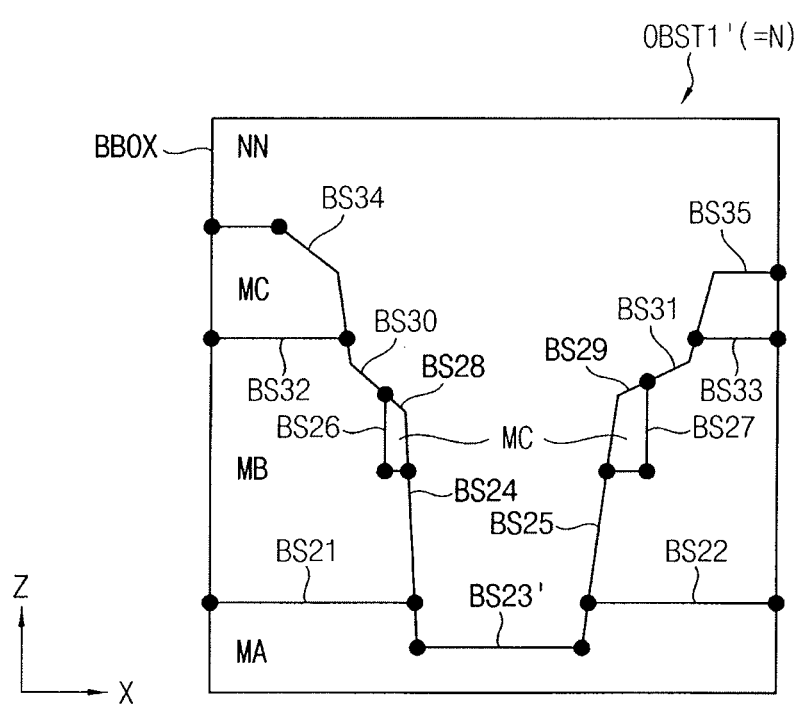
Figure 17A:
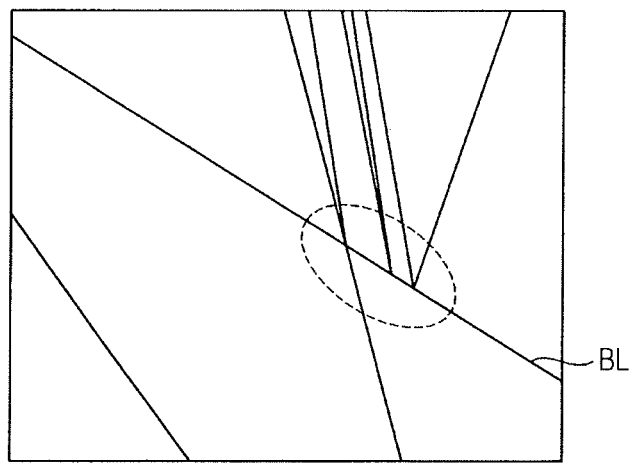
FIGS. 17A and 17B illustrate matching of boundary lines of an output boundary surface structure according to example embodiments.
Figure 17B:
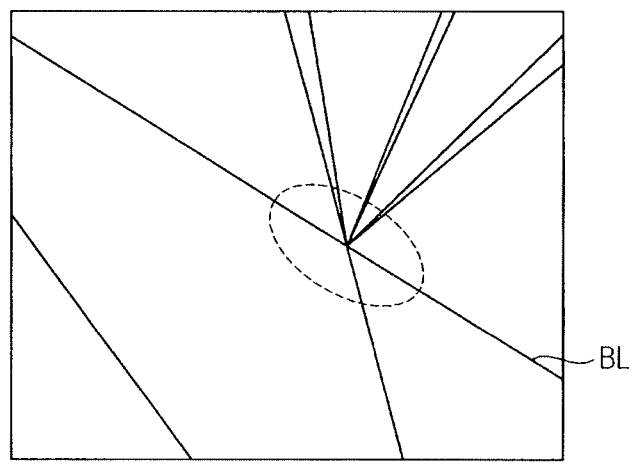

FIG. 16 illustrates an output boundary surface structure OBST1' corresponding to the N type structure when the input boundary surface BS11 in FIG. 6A is not the etching inhibition input boundary surface but the etching permission input boundary surface. The output boundary surface structure OBST1' in FIG. 16 may be substantially the same as the output boundary surface structure OBST1 in FIG. 15, except the output boundary surface BS23'. The material attribute of the output boundary surface BS23' may be as follows.

BS23'→MA_NN

FIGS. 17A and 17B illustrate examples for describing matching of boundary lines of an output boundary surface structure. With respect to a boundary line BL, at which two boundary surfaces cross, FIG. 17A illustrates a mesh structure before a boundary line matching process, and FIG. 17B illustrates a mesh structure after the boundary line matching process.

As illustrated in FIGS. 17A and 17B, edges shorter than a reference value may be removed among edges included in the boundary line BL of output boundary surfaces of the output boundary surface structure. The both end vertexes of the removed edge may be combined into one vertex and thus structure noise or the structure defects may be removed or reduced.

Referring to FIG. 7C, when the valid etching surfaces do not exist (S17: NO), it is determined whether etched material exists (S31). For example, when the etched material does not exist (S31: NO), the input boundary surface structure, e.g., the A type structure may be output as the output boundary surface structure (S32).

Figure 18A:
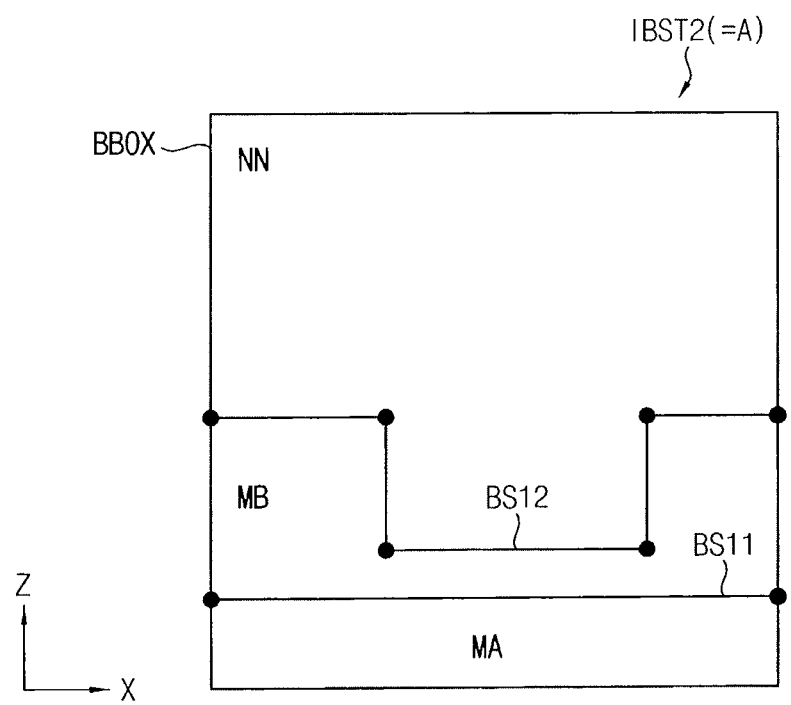
FIGS. 18A through 22 illustrate examples for describing an etching operation method according to example embodiments.
Figure 18B:
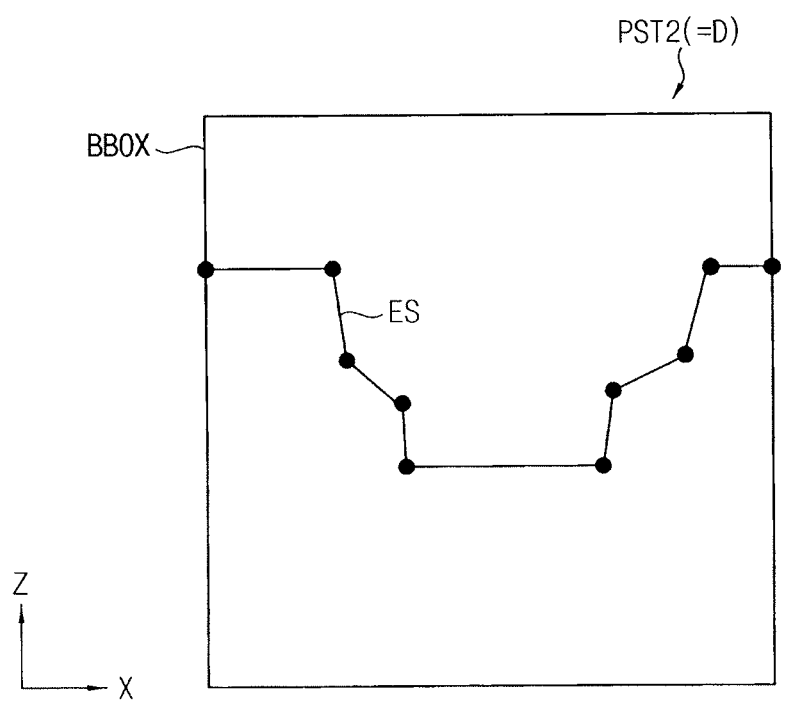
Figure 18C:
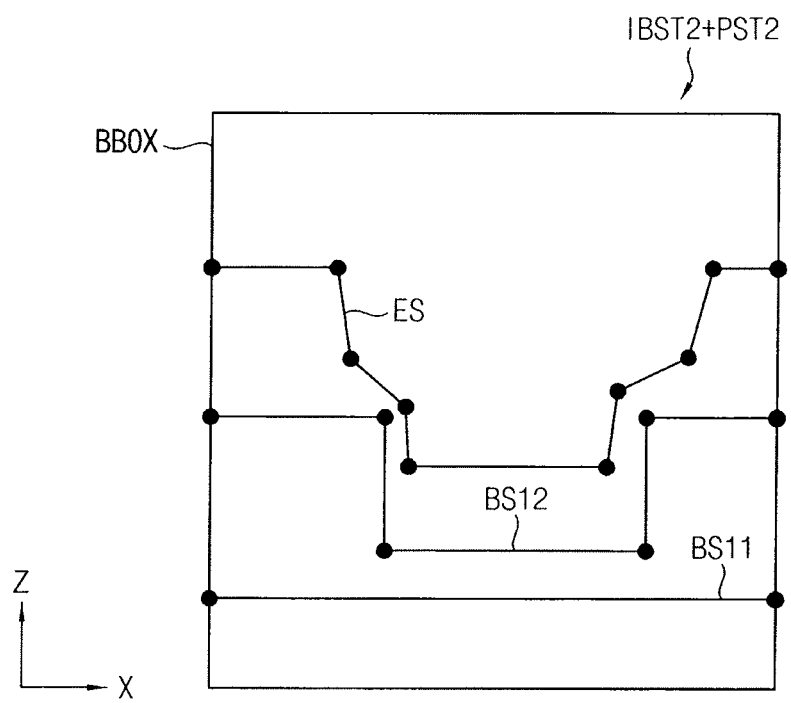

FIGS. 18A, 18B and 18C illustrates an example that an input boundary surface structure is output as an output boundary surface structure. FIG. 18A illustrates an example of an input boundary surface structure IBST2, FIG. 18B illustrates an example of a processing structure PST2. FIG. 18C illustrates a combined structure IBST2+PST2 that is generated by combining the input boundary surface structure IBST2 and the processing structure PST2. For example, when there is no material that is etched actually, an output as the output boundary surface structure may be the same as the input boundary surface structure IBST2.

The input boundary surface structure OBST2 in FIG. 18A including the input boundary surfaces BS11 and BS12 may be represented using the material attribute as follows.

BS11→MA_MB
BS12→MB_NN

The output boundary surface structure including the input boundary surfaces BS21 and BS22 may be represented using the material attribute as follows. The input boundary surface BS11 may be the same as the output boundary surface BS21, and the input boundary surface BS12 may be the same as the output boundary surface B522.

BS21→MA_MB
BS22→MB_NN

Figure 19A:
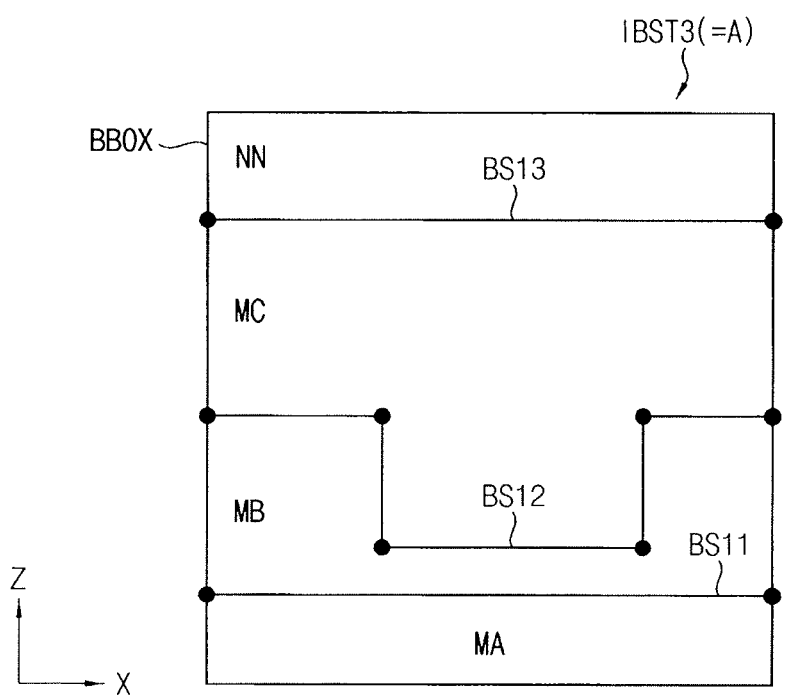
Figure 19B:
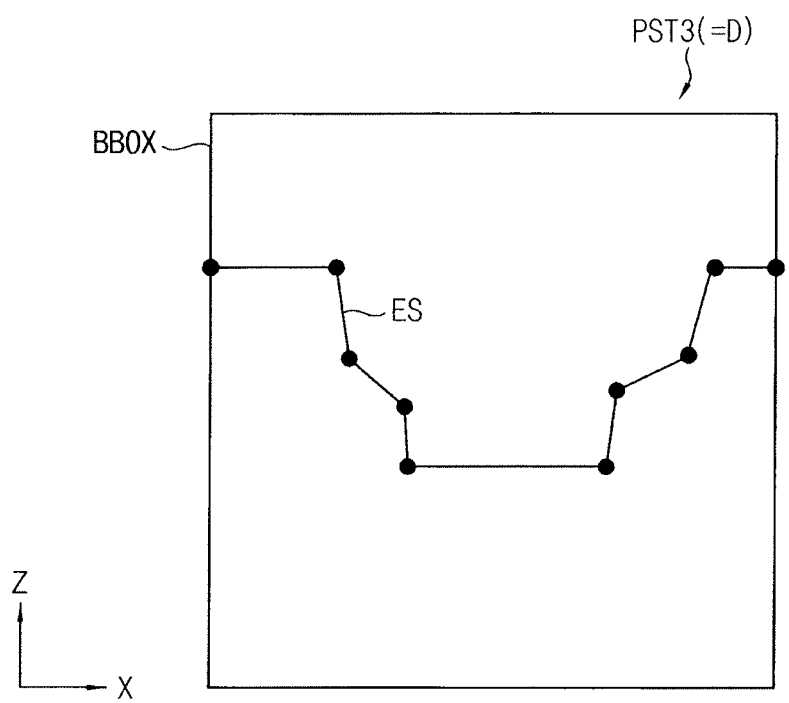
Figure 19C:
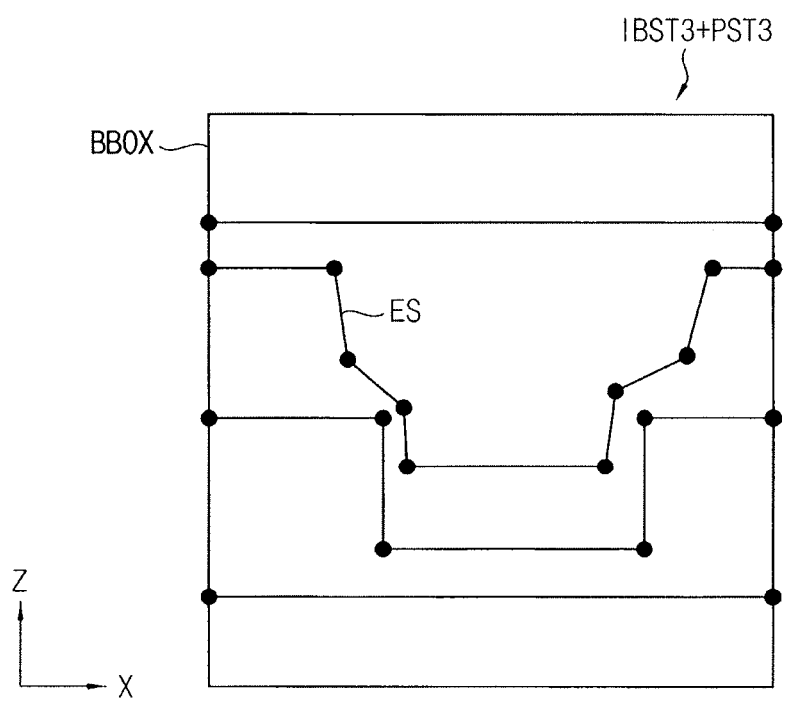

FIGS. 19A, 19B and 19C illustrate an example that actually-etched material exists (S31: YES). FIG. 19A illustrates an example of an input boundary surface structure IBST3, FIG. 19B illustrates an example of a processing structure PST3. FIG. 19C illustrates a combined structure IBST3+PST3 that is generated by combining the input boundary surface structure IBST3 and the processing structure PST3.

Referring to FIG. 19A, the input boundary surface structure IBST3 may include first, second and third input boundary surfaces BS11, BS12 and BS13. As described above, the attribute information may include the material attribute indicating two solid units or materials MA, MB, MC and NN at both sides of each of the input boundary surfaces. The input boundary surface structure OBST3 in FIG. 19A may be represented using the material attribute as follows.

BS11→MA_MB
BS12→MB_MC
BS13→MC_NN

Referring to FIG. 19B, the processing surface PST3 may include an etching surface ES. For example, the processing surface PST3 may be used to generate an output boundary surface structure corresponding to a result of a structure data operation. For example, the output boundary surface structure may be generated by performing the structure data operation that applies the processing structure PST3 in FIG. 19B to the input boundary surface structure IBST3 in FIG. 19A. For example, the structure data operation corresponding to an etching process may be performed, and the output boundary surface structure after performing the etching process on the input boundary surface structure IBST3 using the etching surface ES may be provided.

Figure 20:
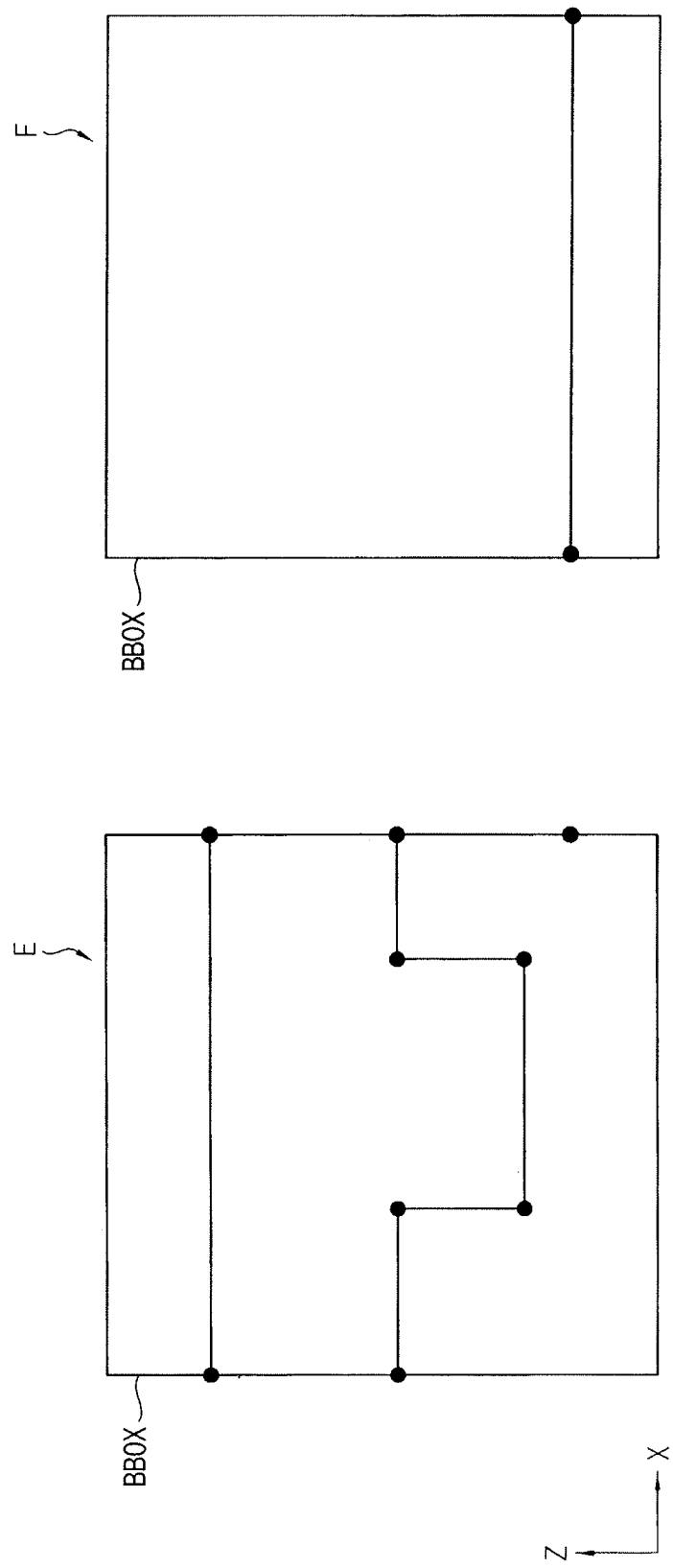

For example, when the A type structure corresponds to the input boundary surface structure IBST3 in FIG. 19A, and the D type structure corresponds to the processing structure PST3 in FIG. 19B, the E type structure including the etching permission input boundary surface and the F type structure including the etching inhibition input boundary surface are illustrated in FIG. 20 according to an example embodiment.

Figure 21A:
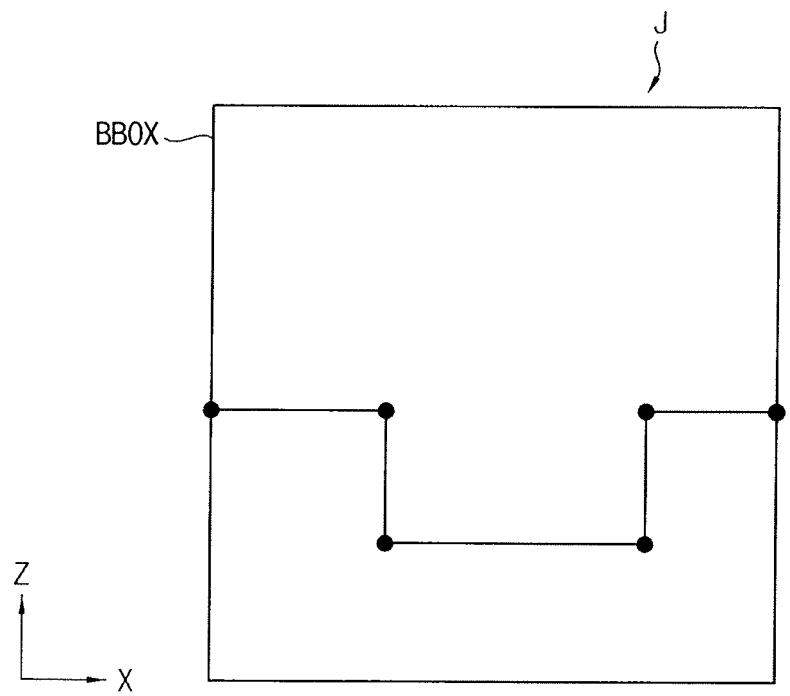

Referring back to FIG. 7C, when the actually-etched material exists (S31: YES), the attribute information may be allocated to the etching surface (set_attribute(D))(S33). A residual boundary surface structure may include residual boundary surfaces corresponding to first portions of the input boundary surfaces that remain after second portions of the input boundary surfaces are removed according to the etching surface (J=trim(E,D)) (S34). FIG. 21A illustrates a J type structure including the residual boundary surfaces that remain after the etching permission input boundary surface in the E type structure in FIG. 20 is etched by the etching surface ES in the D type structure in FIG. 19B.

Figure 21B:
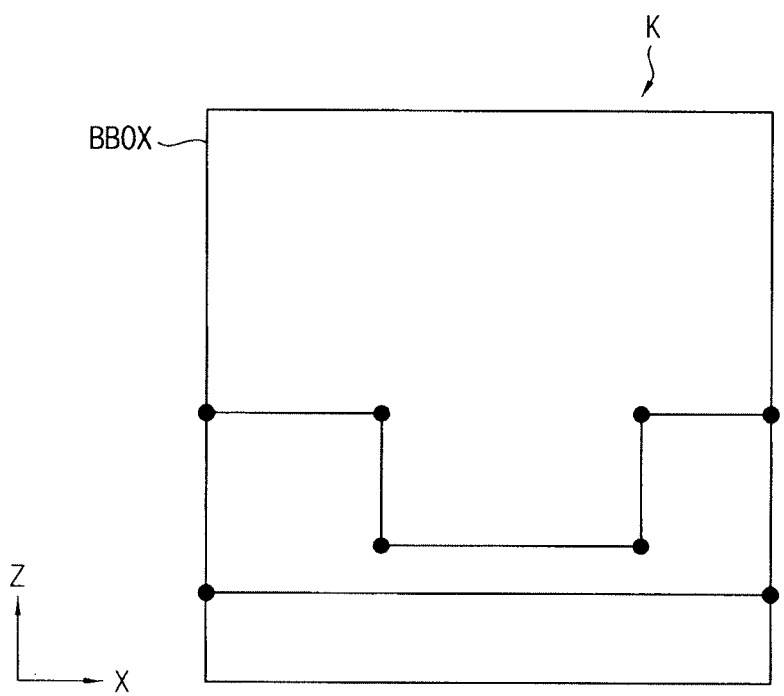

The residual boundary surfaces and the etching inhibition input boundary surface may be combined (K=merge(J,F)) (S35). FIG. 21B illustrates a K type structure that is a combination of the J type structure in FIG. 21A including the residual boundary surface structure and the F type structure in FIG. 20 including the etching inhibition input boundary surface.

Figure 22:
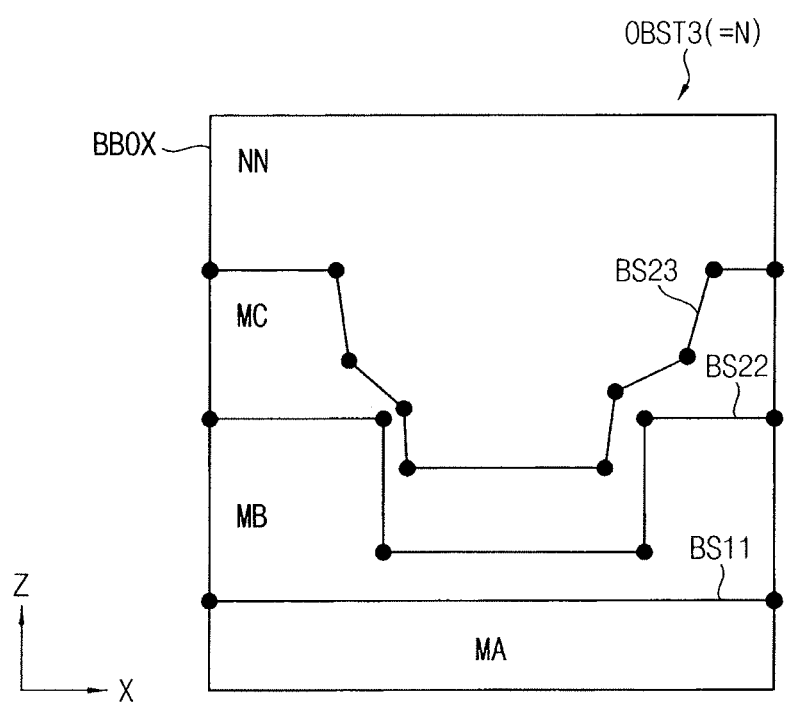

In addition, the processing structure, to which the attribute information is allocated, may be combined to generate a combined structure, e.g., the K type structure (N=merge(K, D)) (S36). FIG. 22 illustrates an N type structure as a combination of the K type structure in FIG. 21B and the processing structure PST3 in FIG. 19B including the etching surface, e.g., the D type structure. The combined structure may be provided as the output boundary surface structure.

The N type structure in FIG. 22 may correspond to the output boundary surface structure OBST3 as described with reference to FIGS. 17C through 21B. The output boundary surface structure OBST3 including the output boundary surfaces BS21, BS22 and BS23 may be represented using the material attribute as follows.

BS21→MA_MB
BS22→MB_MC
BS23→MC_NN

FIGS. 23A and 23B illustrate a planarization data operation method according to example embodiments. For example, the planarization data operation method may be a structure data operation corresponding to a planarization process to remove materials of the input solid structure according to a planarization surface. For example, the planarization surface may correspond to the above-described processing structure PST.

Referring to FIG. 23A, an output boundary surface structure IBST4 may include output boundary surfaces BS21 and BS22 corresponding to a result of the planarization data operation. The output boundary surface structure IBST4 may be provided by performing the planarization data operation that applies the planarization surface PS of a relatively high level to an input boundary surface structure IBST4 including input boundary surfaces BS11 and BS12.

The input boundary surface structure IBST4 may be represented using the material attribute as follows.

BS11→MA_MB
BS12→MB_NN

Further, the output boundary surface structure OBST4 may be represented using the material attribute as follows.

BS21→MA_MB
BS22→MB_NN

As illustrated in FIG. 23B, an output boundary surface structure IBST5 may include output boundary surfaces BS21 and BS22 corresponding to a result of the planarization data operation. The output boundary surface may be provided by performing the planarization data operation that applies the planarization surface PS of a relatively low level to an input boundary surface structure IBST5 including input boundary surfaces BS11 and BS12.

The input boundary surface structure IBST5 may be represented using the material attribute as follows.

BS11→MA_MB
BS12→MB_NN

Further, the output boundary surface structure OBST5 may be represented using the material attribute as follows.

BS21→MA_MB
BS22→MB_NN

Figure 24:
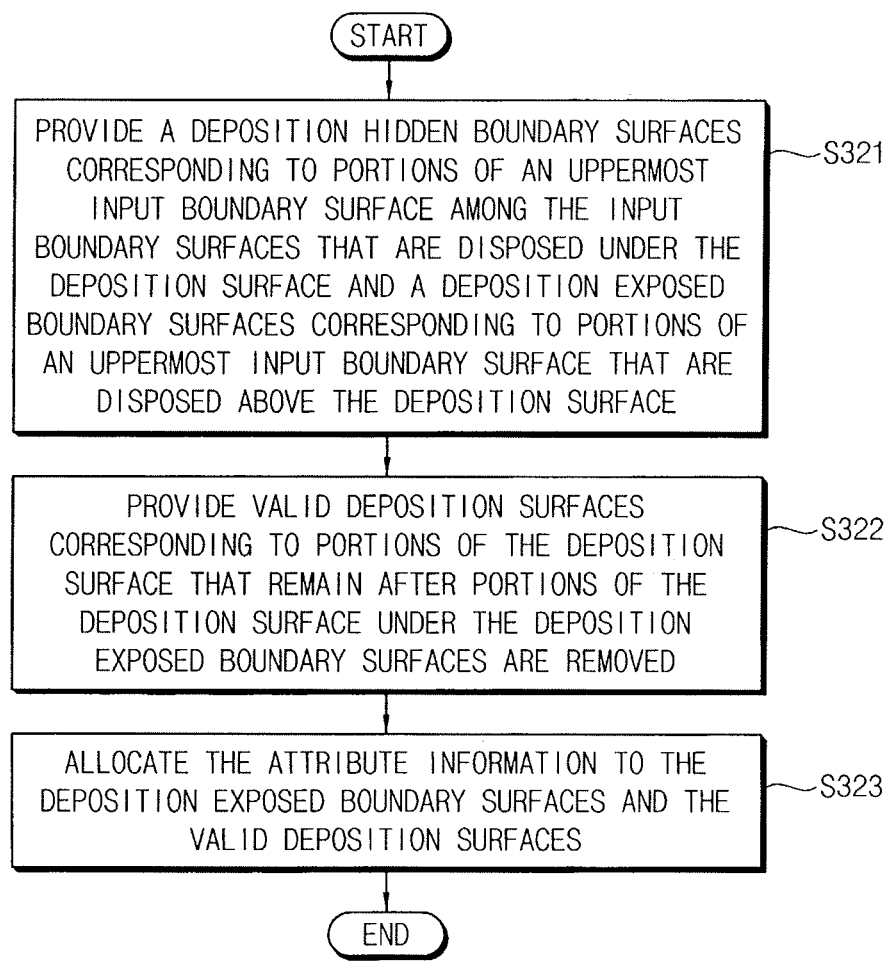
FIG. 24 illustrates a flow chart of a deposition operation method according to example embodiments.

FIG. 24 illustrates a flow chart of a deposition data operation method according to example embodiments. For example, the deposition data operation method may be a structure data operation corresponding to a deposition process to dispose deposition material on materials of the input solid structure according to a deposition surface. For example, the deposition surface may correspond to the processing structure.

Referring to FIG. 24, deposition hidden boundary surfaces and deposition exposed boundary surfaces may be provided (S321). For example, the deposition hidden boundary surfaces may correspond to portions of an uppermost input boundary surface among the input boundary surfaces that are disposed under the deposition surface. The deposition exposed boundary surfaces may correspond to portions of an uppermost input boundary surface that are disposed above the deposition surface. Valid deposition surfaces may be provided (S322). The valid deposition surfaces may correspond to portions of the deposition surface that remain after portions of the deposition surface under the deposition exposed boundary surfaces are removed. The above-described attribute information may be allocated to the deposition exposed boundary surfaces and the valid deposition surfaces (S323).

Figure 25A:
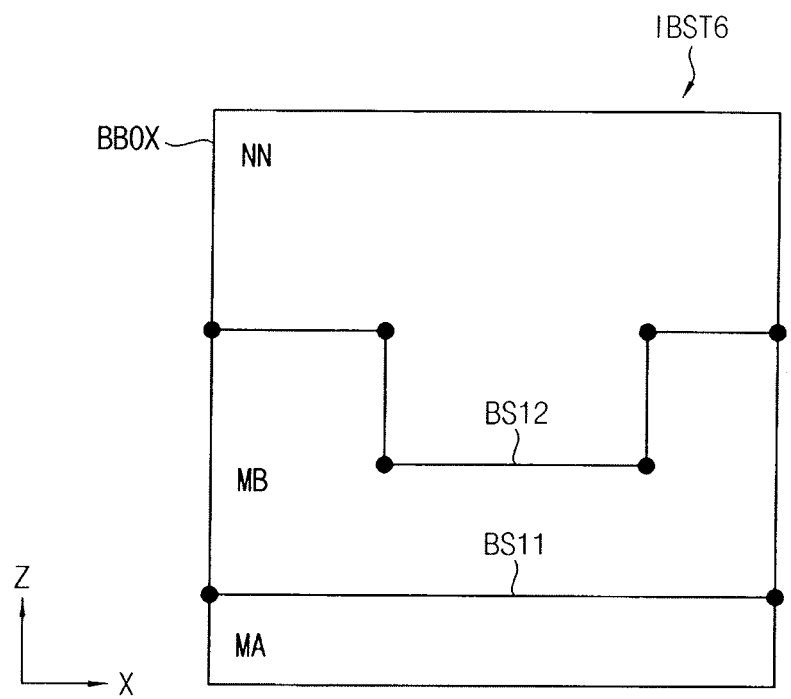
FIGS. 25A through 29 illustrate examples for describing a deposition operation method according to example embodiments.

FIGS. 25A through 29 illustrate a deposition data operation method according to example embodiments. FIG. 25A illustrates an example of an input boundary surface structure IBST6. FIG. 25B illustrates an example of a processing structure PST6. FIG. 25C illustrates a combined structure IBST6+PST6.

Referring to FIG. 25A, the input boundary surface structure IBST6 may include first and second input boundary surfaces BS11 and BS12. For example, attribute information of the first and second input boundary surfaces BS11 and BS12 may include material attribute indicating two solid units or materials MA, MB and NN of the solid units at both sides of each of the input boundary surfaces BS11 and BS12. The input boundary surface structure IBST6 may be represented using the material attribute as follows.

BS11→MA_MB
BS12→MB_NN

Figure 25B:
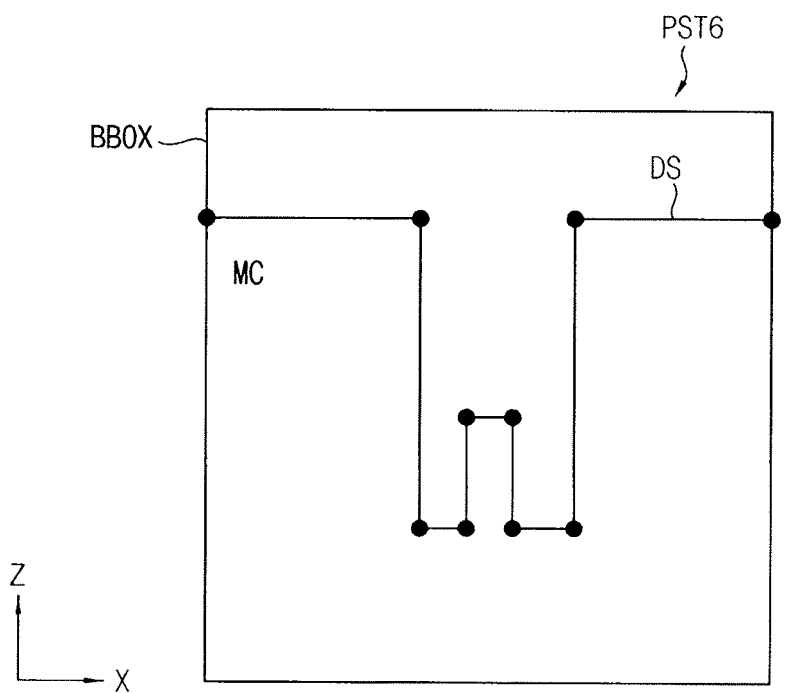

Referring to FIG. 25B, the processing structure PST6 may include a deposition surface DS. For example, the processing structure PST6 may be used to generate an output boundary surface structure corresponding to a result of a structure data operation. For example, the output boundary surface structure may be generated by performing the structure data operation that applies the processing structure to the input boundary surface structure. For example, the structure data operation corresponding to a deposition process may be performed, and the output boundary surface structure after depositing the deposition material MC based on the deposition DS may be provided.

Figure 25C:
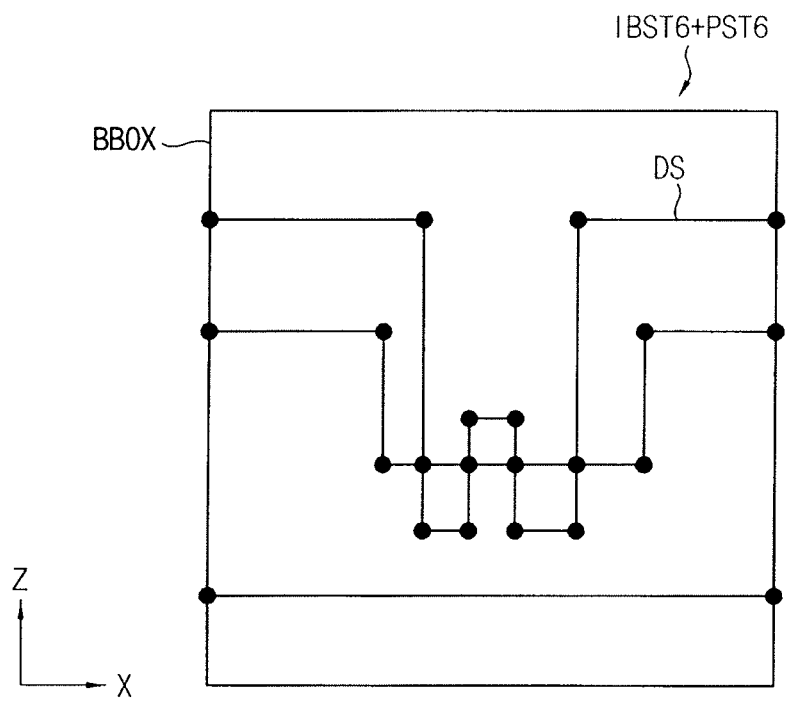
Figure 26:
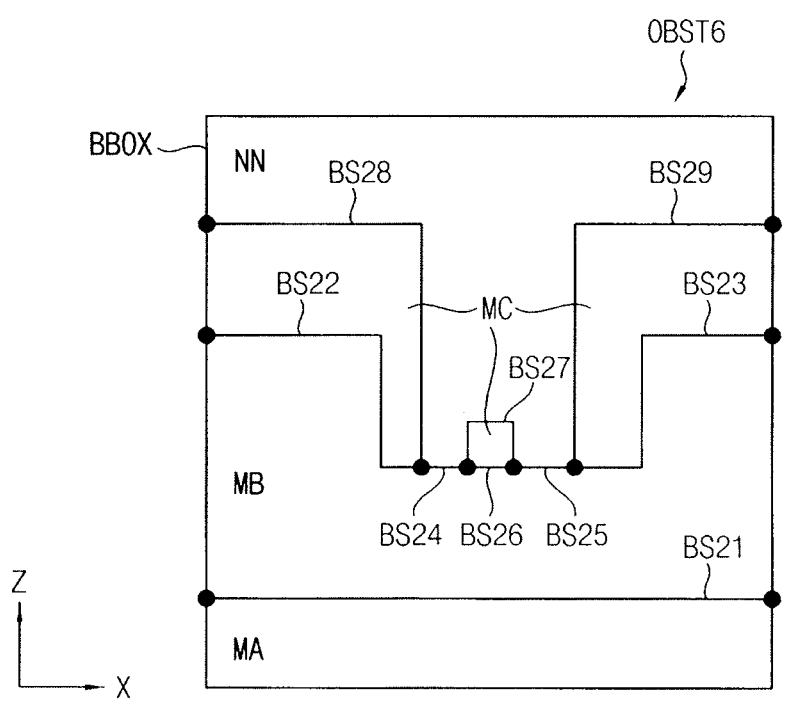

FIG. 26 illustrates the output boundary surface structure OBST6 as described with reference to FIGS. 24 through 25C. The output boundary surface structure OBST6 including the output boundary surfaces BS21~BS29 may be represented using the material attribute as follows.

BS21→MA_MB
BS22, BS23, BS26→MB_MC
BS24, BS25→MB_NN
BS27, BS28, BS29→MC_NN

For example, regarding the input boundary surface structure IBST6 in FIG. 25A, deposition hidden boundary surfaces and deposition exposed boundary surfaces may be provided. The deposition hidden boundary surface may correspond to portions of an uppermost input boundary surface BS12 among the input boundary surfaces BS11 and BS12 that are disposed under the deposition surface DS. The deposition exposed boundary surfaces may correspond to portions of the uppermost input boundary surface BS12 that are disposed above the deposition surface DS.

In some example embodiments, attribute information of the deposition hidden boundary surfaces before the deposition process may be updated based on the deposition material MC, and attribute information of the deposition exposed boundary surfaces before the deposition process may be maintained. Referring to FIG. 26, the output boundary surfaces BS22, BS23 and BS26 may correspond to the deposition hidden boundary surfaces, and the output boundary surfaces BS24 and BS25 may correspond to the deposition exposed boundary surfaces.

The material attribute MB_MC of the to the deposition hidden boundary surfaces BS22, BS23 and BS26 may be obtained by updating the material attribute MB_NN before the deposition process using the deposition material MC. Further, the material attribute MB_NN of the deposition hidden boundary surfaces BS24 and BS25 before the deposition process may be maintained.

In some example embodiments, attribute information of lower input boundary surfaces among the input boundary surfaces except an uppermost input boundary surface before a deposition process may be maintained without change. For example, referring to FIGS. 25A, 25B, 25C, and 26, among the input boundary surfaces BS11 and BS12, the lower input boundary surface BS11 may maintain the material attribute MA_MB before the deposition process, and determined as the material attribute MA_MB of the corresponding output boundary surface BS21.

Figure 27:
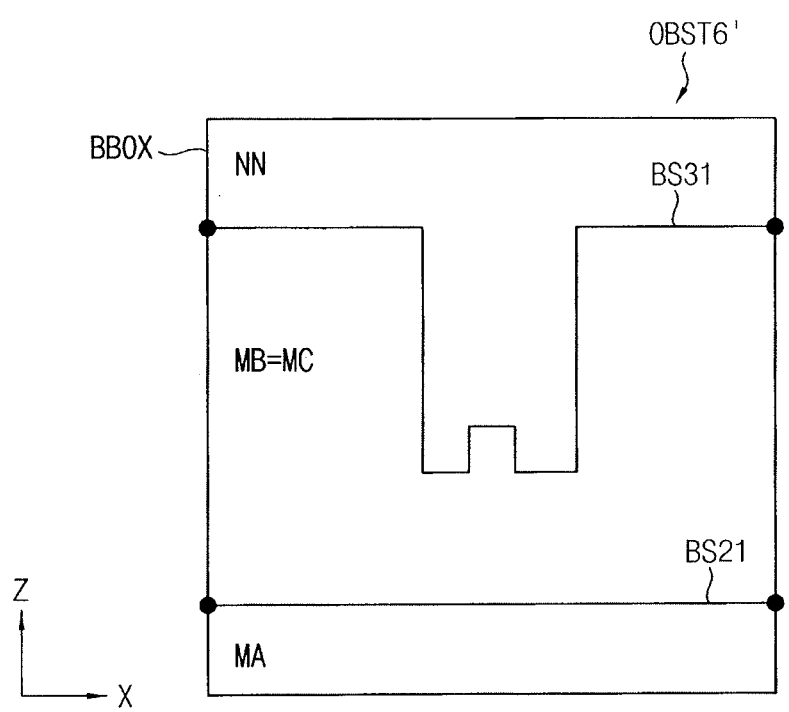

FIG. 27 illustrates an output boundary surface structure OBST6', which is similar as described with reference to FIGS. 24 through 26, but the deposition material MC is the same as the uppermost material MB of the input boundary surface structure. The output boundary surface structure OBST6' including the output boundary surfaces BS21 and BS31 may be represented using the material attribute as follows.

BS21→MA_MB
BS31→MB_NN

Figure 28:
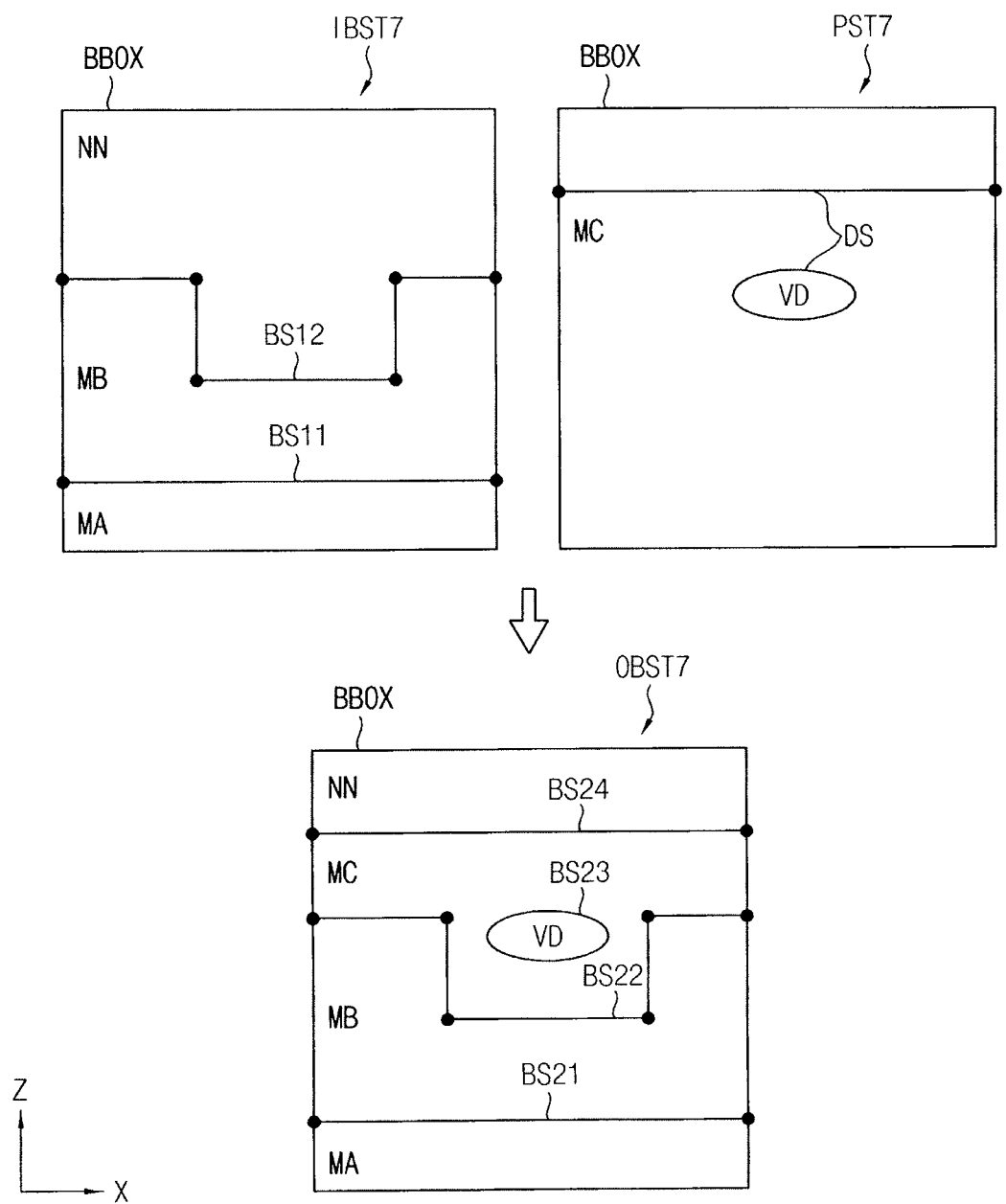
Figure 29:
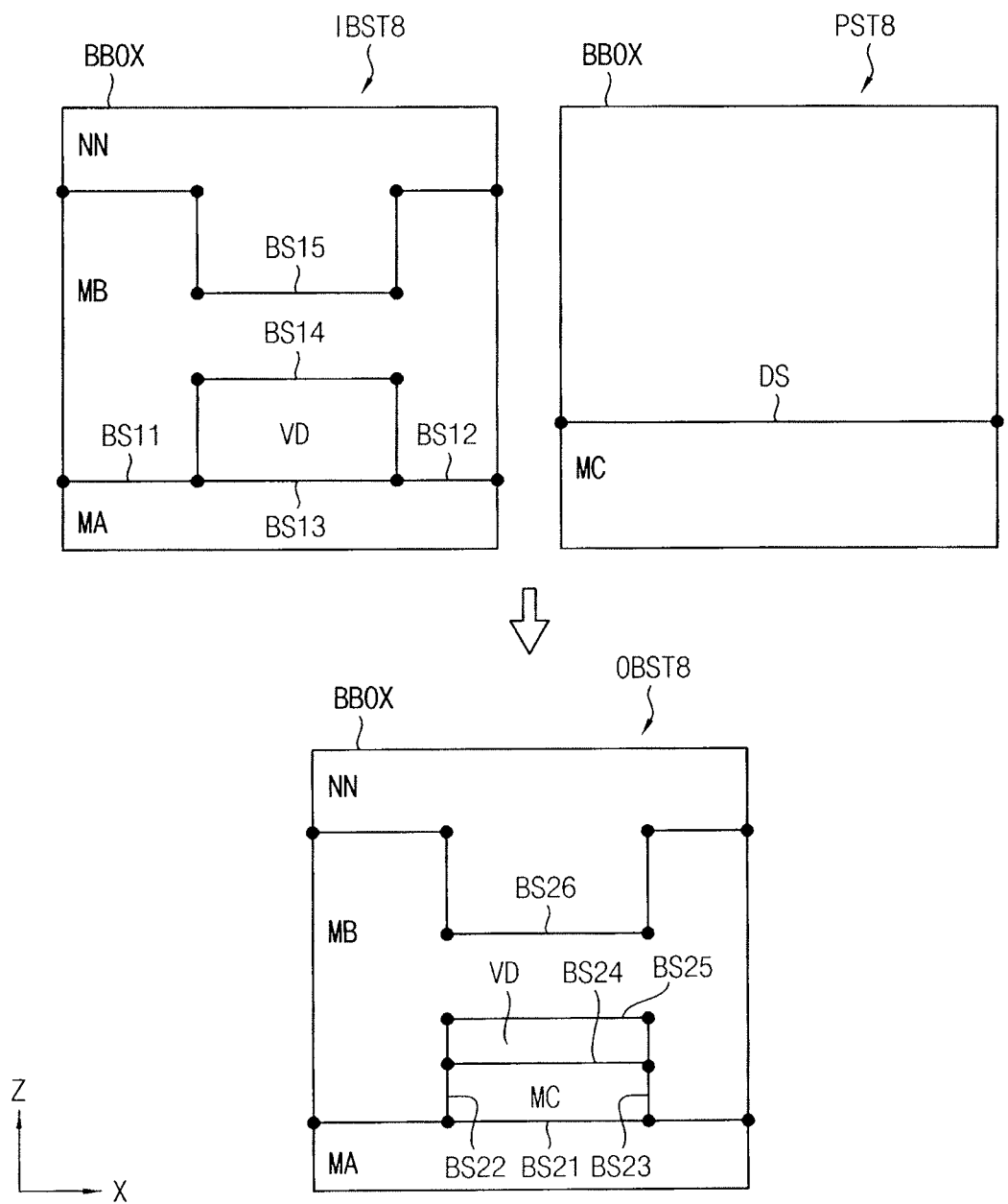

FIGS. 28 and 29 illustrates a deposition data operation method according to example embodiments. For example, the deposition data operation method may be a structure data operation corresponding to a deposition process to dispose deposition material on materials of the input solid structure according to a deposition surface. For example, the deposition surface may correspond to the above-described processing structure PST.

As illustrated in FIG. 28, an output boundary surface structure IBST7 including output boundary surfaces BS21~BS24 may correspond to a result of the deposition data operation, and may be provided by performing the deposition data operation that applies the deposition surface DS including a void VD indicating an empty space to an input boundary surface structure IBST7 including input boundary surfaces BS11~BS15.

In the same way, as illustrated in FIG. 29, an output boundary surface structure IBST8 including output boundary surfaces BS21~BS26 may correspond to a result of the deposition data operation, and may be provided by performing the deposition data operation that applies the deposition surface DS to an input boundary surface structure IBST7 including a void VD and input boundary surfaces BS11~BS15.

The attribute information allocated to the input boundary surface structures IBST7 and IBST8 and the output boundary surface structures OBST7 and OBST8 may be obtained in the same way as described above.

Figure 30:
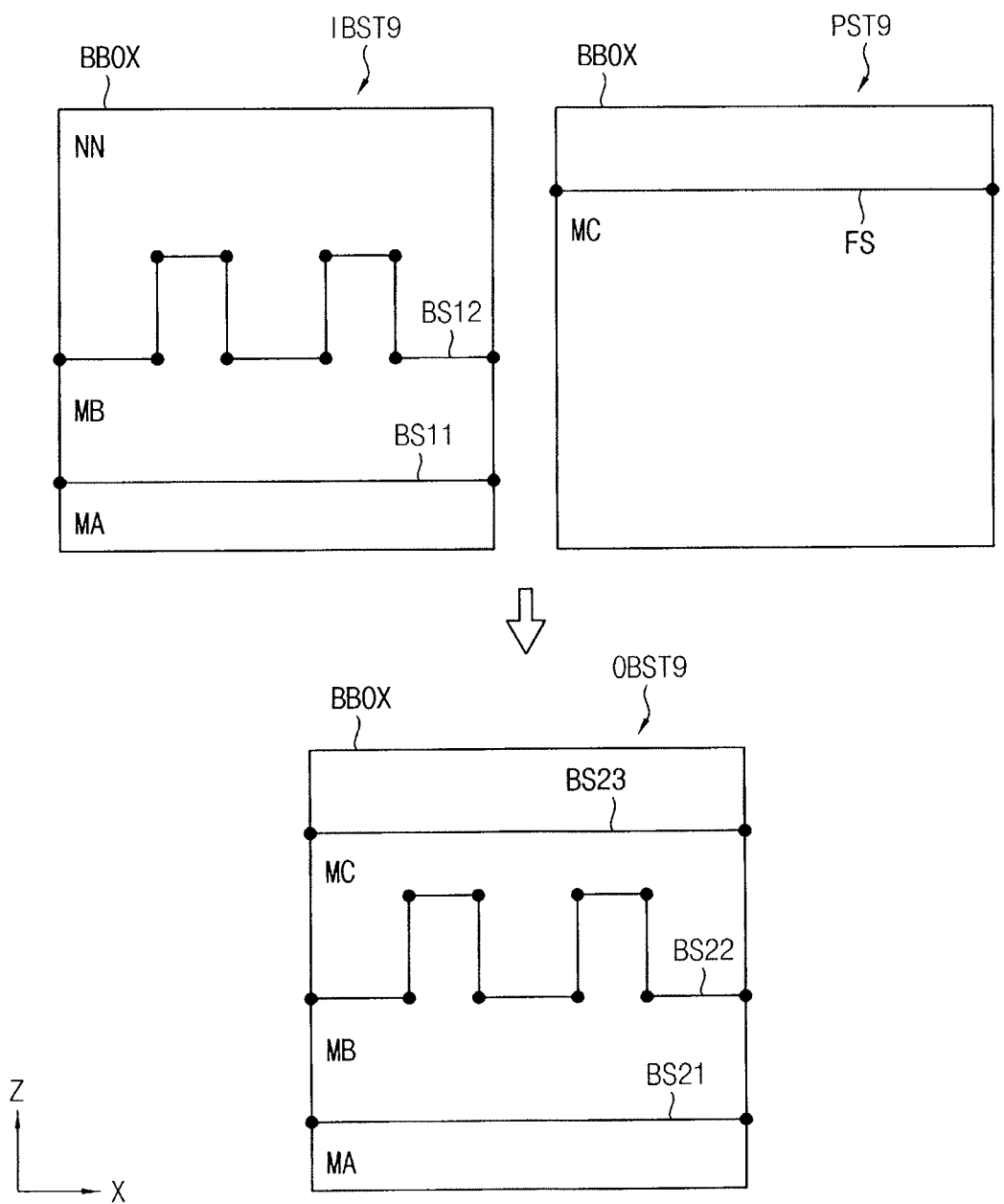
FIGS. 30 and 31 illustrate examples for describing a filling operation method according to example embodiments.
Figure 31:
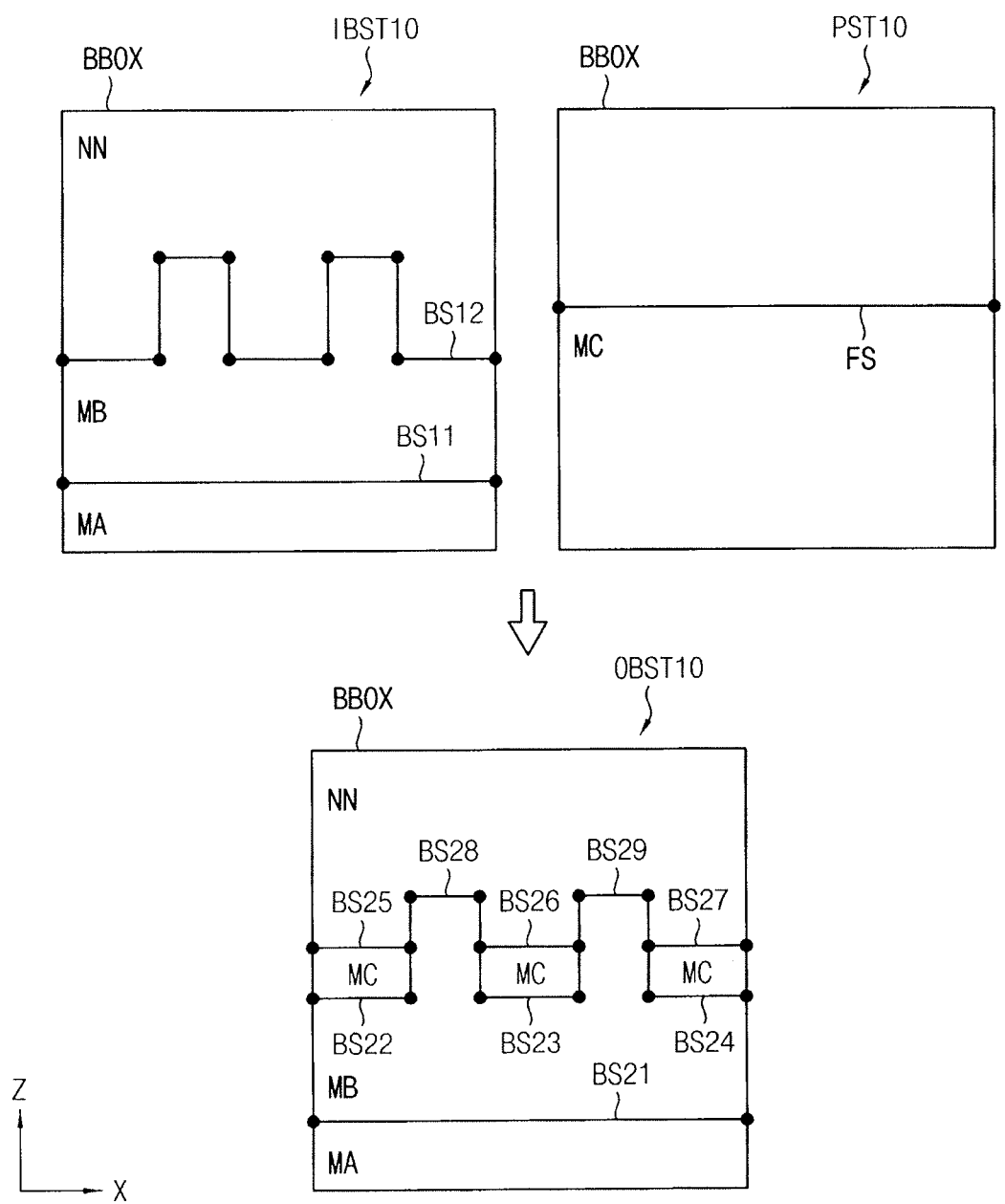

FIGS. 30 and 31 illustrate a filling data operation method according to example embodiments. For example, the filling data operation method may be a structure data operation corresponding to a filling process to dispose filling material on materials of the input solid structure according to a filling surface. For example, the filling surface may correspond to the processing structure.

As illustrated in FIG. 30, an output boundary surface structure IBST9 including output boundary surfaces BS21, BS22 and BS23 may correspond to a result of the filling data operation, and may be provided by performing the filling data operation that applies the filling surface FS of a relatively high level to an input boundary surface structure IBST9 including input boundary surfaces BS11 and BS12.

In the same way, as illustrated in FIG. 31, an output boundary surface structure IBST10 including output boundary surfaces BS21~BS29 may correspond to a result of the filling data operation, and may be provided by performing the filling data operation that applies the filling surface FS of a relatively low level to an input boundary surface structure IBST10 including input boundary surfaces BS11 and BS12.

The attribute information allocated to the input boundary surface structures IBST9 and IBST10 and the output boundary surface structures OBST9 and OBST10 may be obtained in the same way as described above.

Figure 32A:
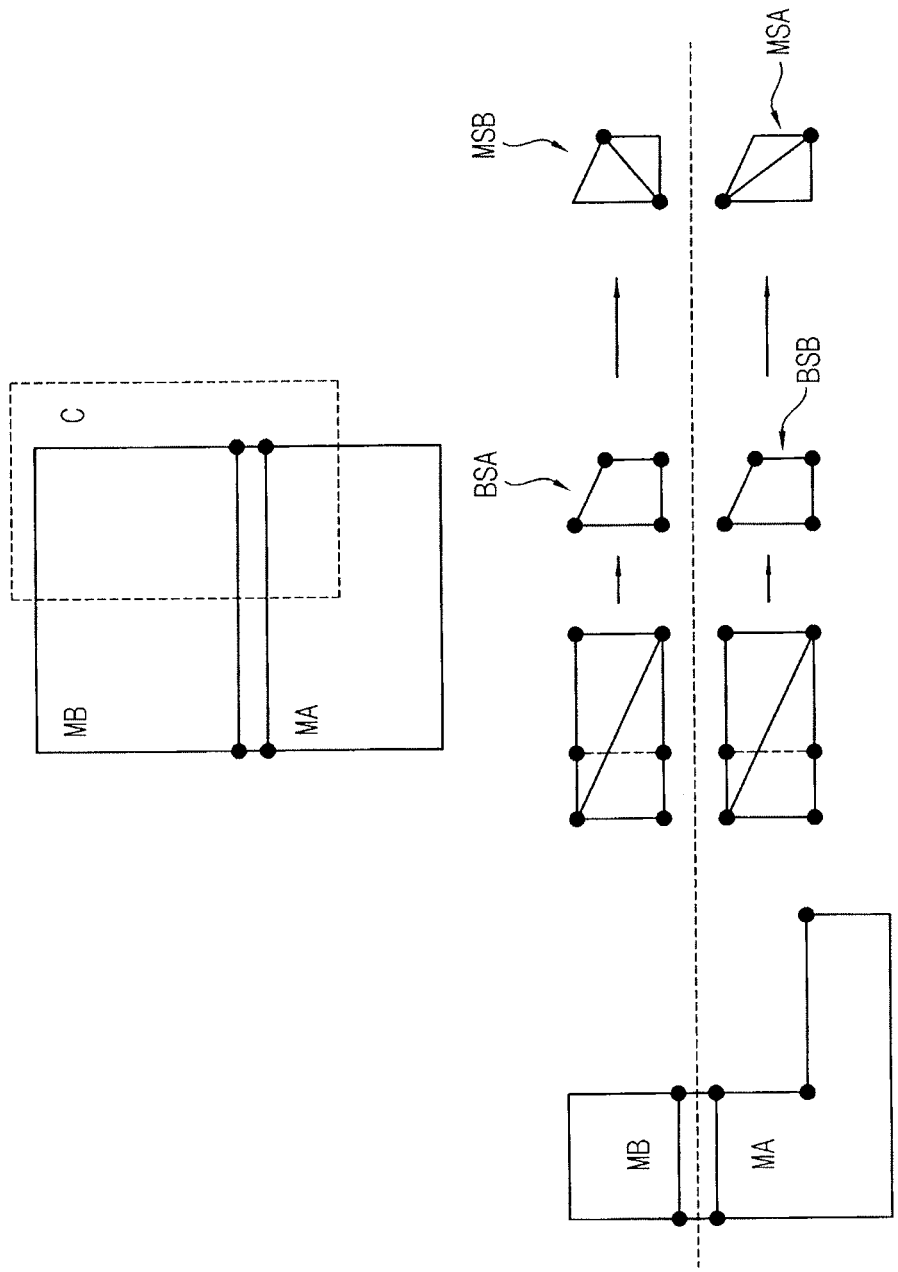
FIGS. 32A and 32B illustrate examples for describing defects caused in a structure data operation based on a solid structure.
Figure 32B:
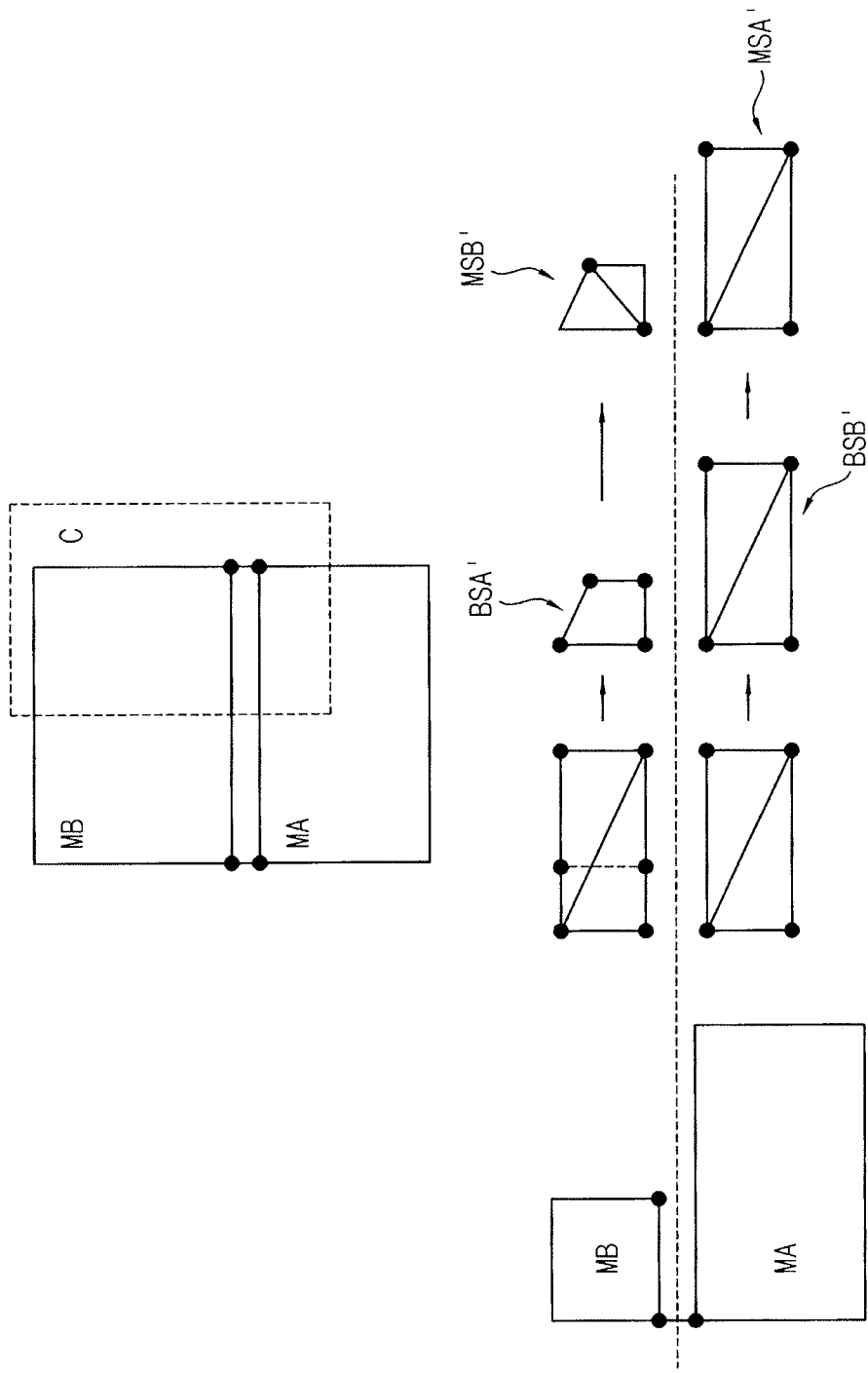

FIGS. 32A and 32B illustrate examples for describing defects caused in a structure data operation based on a solid structure. FIG. 32A is related to an etching process of (MA+MB)−C, and FIG. 32B is related to an etching process of MA+(MB−C).

As illustrated in FIG. 32A, a boolean data operation may occur twice at boundary surfaces BSA and BSB of the two adjacent solid units or materials MA and MB. As a result, if triangulation is progressed differently with respect to the two boundary surfaces BSA and BSB, mesh structures MSA and MSB of the two boundary surfaces BSA and BSB corresponding to the two adjacent solid units may be different from each other.

As illustrated in FIG. 32B, when different data operations are performed with respect to two different solid units or materials, mesh structures MSA' and MSB' of two boundary surfaces BSA' and BSB' corresponding to the two solid units may be different from each other.

According to example embodiments, structure data operations may be performed based on boundary surface structure, mismatch as described with reference to FIGS. 32A and 32B may be prevented such that efficiency of structure data operation may be enhanced.

Figure 33:
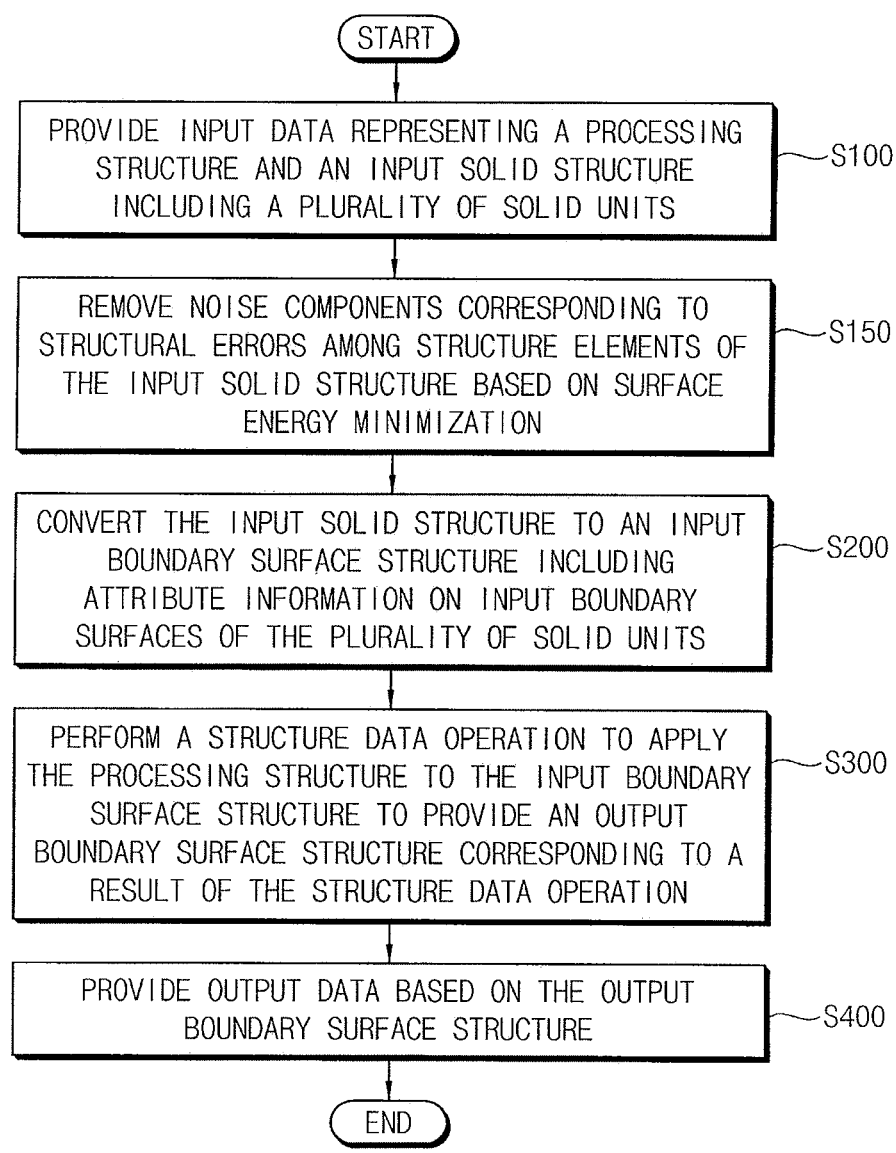
FIG. 33 illustrates a flow chart of a structure data operation method according to example embodiments.

FIG. 33 illustrates a flow chart of a structure data operation method according to example embodiments. Referring to FIG. 33, input data may be provided (S100). The input data may include a processing structure and an input solid structure including a plurality of solid units. The processing structure and the input solid structure may be a three-dimensional structure that is divided by polyhedrons. The three-dimensional structure may be composed of structure elements of vertexes, edges, faces and solid units. The processing structure may include an etching surface for an etching process, a planarization surface for a planarization process, a deposition surface for a deposition process, a filling surface for a filling process, and so on.

The input data including the input solid structure and the processing structure may be provided through various methods. In some example embodiments, the input data may be generated by an electronic design automation (EDA) tool. In other example embodiments, the input data may be provided by processing image data that is captured using an image sensor. In still other example embodiments, the input data may be provided by restructuring data using a computer vision. Further, the input data may be provided through other various methods.

Noise components corresponding to structural errors may be removed among structure elements of an input solid structure based on surface energy minimization (S150). The data processing may be performed more efficiently by removing the noise components and performing the structure data operation based on the noise-reduced data.

The input solid structure may be converted to an input boundary surface structure including attribute information on input boundary surfaces of the plurality of solid units (S200). The solid structure and the boundary surface structure are the same as described below above reference to FIGS. 3 and 4.

A structure data operation may be performed to apply the processing structure to the input boundary surface structure such that an output boundary surface structure corresponding to a result of the structure data operation is generated (S300). Output data may be provided based on the output boundary surface structure (S400).

For example, as the input boundary surface structure includes the attribute information on the input boundary surfaces, the output boundary surface structure may include attribute information on output boundary surfaces. In some example embodiments, data corresponding to the output boundary surface structure may be provided as the output data. In other example embodiments, the output boundary surface structure may be converted to an output solid structure, and data corresponding to the output solid structure may be provided as the output data.

According to example embodiments, the structure data operation method may reduce, e.g., data processing time and data processing amounts by simplifying the structure data operation between the solid units through using the boundary surface structure. Further, noise and errors in a three-dimensional structure may be reduced through the simplified structure data operation.

Figure 34:
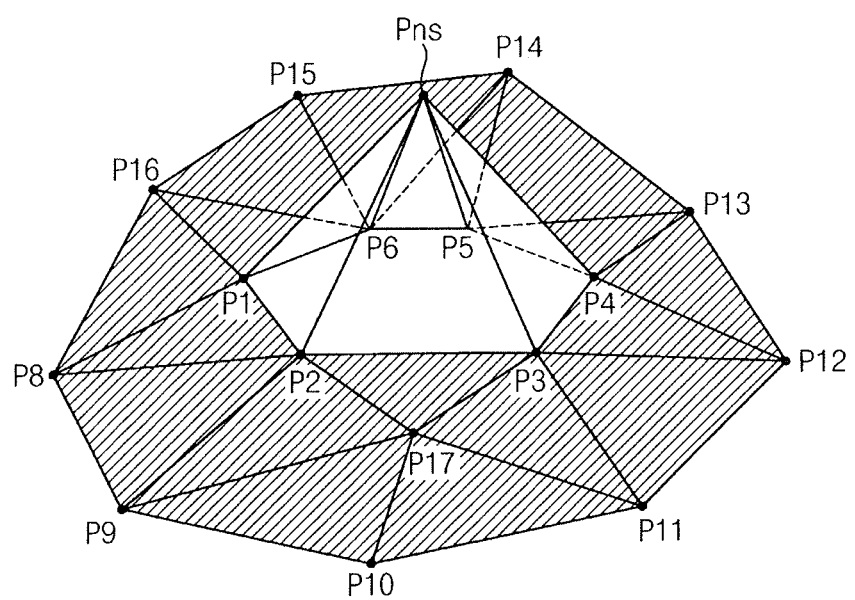
FIG. 34 illustrates an example for describing a process of setting boundary conditions.

FIG. 34 illustrate an example for describing a process of setting boundary conditions. Referring to FIG. 34, shaded triangular meshes may correspond to signal components, and not-shaded triangular meshes may correspond to noise components. The shaded and non-shaded triangular meshes may correspond to faces or surfaces as one of the structure elements, and each triangular mesh may include three edges and three vertexes.

In some example embodiments, faces or surfaces as one of the structure elements may be grouped into a plurality of face groups by analyzing plane equations of the faces or the surfaces. Further, areas of the faces or surfaces in each face group may be summed to obtain each area ratio. The faces in each face group may be classified as signal components when the area ratio is greater than a threshold ratio. Further, the faces or the surfaces may be classified as the noise components when the area ratio is smaller than the threshold ratio. For example, when a first face is determined as a signal component, boundary conditions or constraints may be set such that structure elements of the first face as the signal component may move only on the first face. In contrast, when a second face is determined as a noise component, boundary condition or constrains may be set such that structure elements of the second face as the noise component may move freely to be effected by a structure modification for surface energy minimization.

Referring to FIG. 34, the noise remover 23 in FIG. 2 may classify a first vertex as a signal component when the first vertex is included in at least one of faces that are classified as a signal component. Further, the noise remover 23 may classify a second vertex as a noise component when the second vertex is included in only faces that are classified as a noise component. Referring to FIG. 34, only one vertex Pns may be included in the faces that are classified as the noise component. Further, other vertexes P1 through P16 may be included in at least one of the faces that are classified as the signal component. Thus, the vertex Pns may be classified as the noise component, and the other vertexes P1 through P16 may be classified as the signal components.

After all of the vertexes are classified as the signal component or the noise component, the noise remover 23 may set the boundary conditions or the constraints with respect to the vertexes that are classified as the signal component. For example, the boundary conditions or the constraints may be set such than the vertex classified as the signal component may move on the face while the smoothing data operation, e.g., the surface energy minimization is performed. In contrast, the structure elements of the face classified as the noise component may move freely to be effected by the structure modification for the surface energy minimization.

Figure 35:
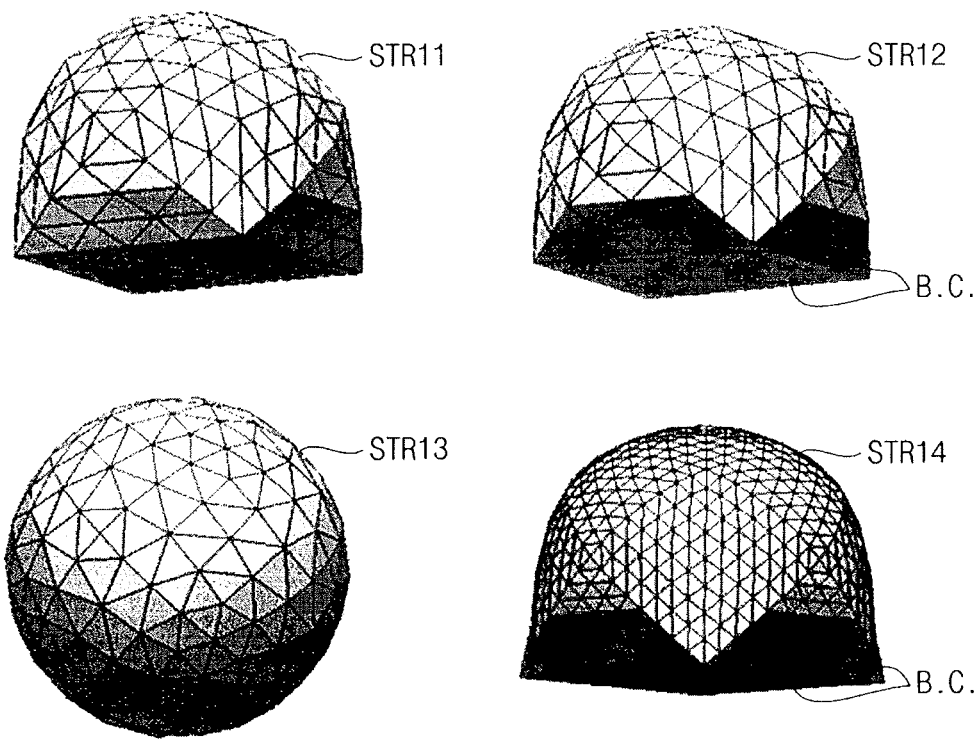
FIG. 35 illustrates an example for describing structure noise removal by setting boundary conditions.

FIG. 35 illustrates an example for describing structure noise removal by setting boundary conditions. Referring to FIG. 35, a first structure STR11 may be an example input structure. A second structure STR12 may be the same as the first structure STR11 except having boundary conditions (B.C.). A third structure STR13 may be an output structure corresponding to a result of performing the smoothing data operation with respect to the first structure STR11 without the boundary conditions. A fourth structure STR14 may be an output structure corresponding to a result of performing the smoothing data operation with respect to the second structure STR12 with the boundary conditions.

As represented by the third structure STR13, when the boundary conditions are not set, the first structure STR11 may be distorted to a sphere by the smoothing data operation. Further, as represented by the fourth structure STR14, when the boundary conditions are set, the original shape of the second shape STR2 may be maintained.

Figure 36:
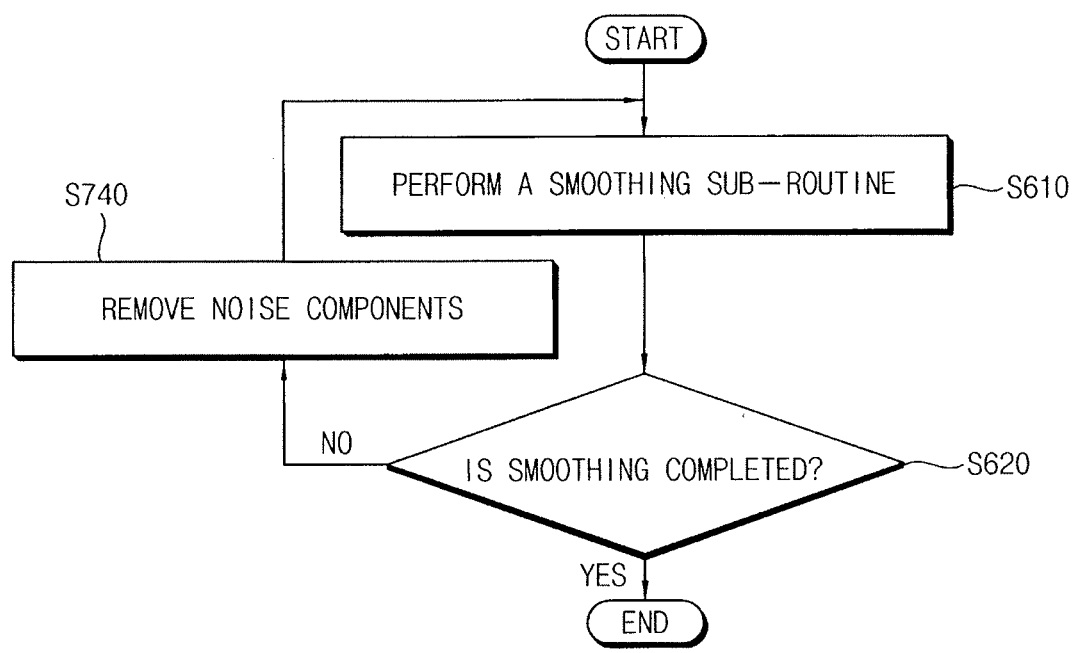
FIG. 36 illustrates a flow chart of an example embodiment of performing a smoothing operation according to example embodiments.

FIG. 36 illustrates an example of performing a smoothing data operation according to example embodiments. Referring to FIG. 36, the noise remover 23 may perform a smoothing sub-routine (S610). The mentioned smoothing data operation may be performed such that the smoothing sub-routine may be repeatedly executed based on data including a structure and boundary conditions.

The smoothing data operation may be implemented in various ways. For example, the smoothing data operation may be performed by a restructuring method using a surface energy minimization. For example, a structure calculation based on the surface energy minimization may be used mainly in a field of material science, which is applied to a grain growth of polycrystalline material, a solder shape of packaging material, a fluid shape prediction, etc.

In some example embodiments, a smoothing process to remove the noise components corresponding to structural errors among structure elements of the input solid structure may be performed based on surface energy minimization using following expressions, $$T = \left(\frac{\alpha}{V_1 \cdot \text{Min}(diA1)}\right)^{(1+N_1)} + \left(\frac{\alpha}{V_2 \cdot \text{Min}(diA2)}\right)^{(1+N_2)}$$

$$E = \frac{T}{2}\|s_0 \times s_1\|$$

In the above expressions, T is a surface tension of each surface, α is a constant. V1 and V2 are volume units of two bodies including each surface, N1 and N2 are numbers of edges having three or more surfaces shared by each edge of the two bodies, diA1 and diA2 are minimum surface angles among surface angles of the two bodies, S0 and S1 are two vectors connecting vertexes of each surface, and E is surface energy.

As a volume unit of a body formed by faces is decreased (e.g., as V1 and V2 in the above expressions are decreased), the higher surface tension may be imposed. As the number of the shared faces is increased (e.g., N1 and N2 in the above expressions are increased), the higher surface tension may be imposed. As the minimum surface angle is decreased (e.g., diA1 and diA2 in the above expressions are decreased), the higher surface tension may be imposed.

The noise remover 23 may determine whether the smoothing process is completed (S620) whenever the smoothing sub-routine is finished. The completion of the smoothing process may be determined variously, for example, depending on the scheme of the smoothing process, the degree of the noise reduction, etc.

In some example embodiments, when the smoothing process is performed based on the surface energy minimization, the surface energy before the smoothing sub-routine and the surface energy after the smoothing sub-routine may be obtained. It may be determined that the smoothing process is completed when the amount of reduction of the surface energy from before to after the smoothing sub-routine is smaller than a reference value. In other example embodiments, a displacement of a vertex classified as a noise component may be obtained, and it is determined that the smoothing process is completed when the displacement is smaller than a reference value.

When the noise remover 23 determines that the smoothing process is completed (S620: YES), the smoothing data operation may be completed, and the noise remover 23 may provide the output data including the output structure by reducing noise from the input structure.

When the noise remover 23 determines that the smoothing process is not completed (S620: NO), the noise remover 23 may remove some noise components and performs the smoothing sub-routine again (S610) based on the data and the boundary conditions with respect to the noise-removed data.

Figure 37:
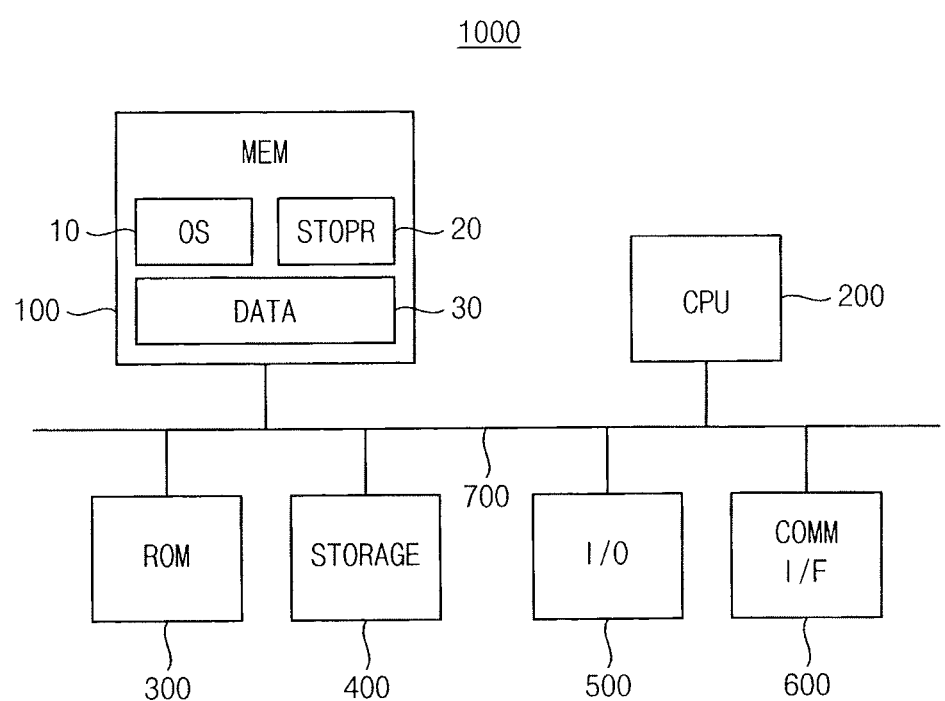
FIG. 37 illustrates an electronic system according to example embodiments.

FIG. 37 illustrates an electronic system according to example embodiments. Referring to FIG. 37, a computer-based electronic system 1000 may include a memory device MEM 100, a processor CPU 200, a read only memory device ROM 300, a storage device 400, an input-output device I/O 500, a communication interface COMM I/F 600, and a signal bus 700 electrically connecting them. The memory device 100 may, as a main memory, store operation system OS 10, a program STOPR 20 for performing the structure data operation as described above, and data 30.

The method and device for performing the structure data operation based on the boundary surface data operation according to example embodiments may be implemented with hardware, software or a combination of hardware and software. For example, the structure data operation device as described with reference to FIG. 2 may be implemented using a program stored in the memory device 100 that is readable by the processor 200.

The input device in the input-output device 500 may receive input data representing an input structure. The memory device may store information including program routines to convert the input solid structure to an input boundary surface structure including attribute information on input boundary surfaces of the plurality of solid units and perform a structure data operation to apply the processing structure to the input boundary surface structure to provide an output boundary surface structure corresponding to a result of the structure data operation; The output device included in the input-output device 500 may display the input solid structure and the output solid structure. The processor 200 may be connected to the input device, the output device and the memory device to control an execution of the program routines.

As described above, the methods and devices according to example embodiments may reduce data processing time by simplifying the structure data operation between the solid units using the boundary surface structure. Further, noise and errors in a three-dimensional structure may be reduced through the simplified structure data operation.

The example embodiments may be applied to various fields requiring analysis and/or processing of three-dimensional structure. For example, the example embodiments may be applied to fields for analyzing and processing data generated by an electronic design automation (EDA) tool, data provided by processing image data that is captured using an image sensor, data provided by restructuring data using a computer vision.

The example embodiments may be applied to designing and manufacturing processes of electronic devices and systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

Various operations of methods described above may be performed as is suitable, such as by various hardware and/or software components, modules, and/or circuits. When implemented in software, the operations may be implemented using, for example, an ordered listing of executable instructions for implementing logical functions, and may be embodied in a processor-readable medium for use by or in connection with an instruction execution system, apparatus, or device, such as a single or multiple-core processor or processor-containing system.

In some embodiments, blocks or steps of a method or algorithm and functions described in connection with the embodiments disclosed herein may be embodied directly in hardware, in a software module executed by a processor, or in a combination of software and hardware. If implemented in software, the functions may be stored on or transmitted over as one or more instructions or code on a tangible, non-transitory computer-readable medium. A software module may reside in, for example, Random Access Memory (RAM), flash memory. Read Only Memory (ROM), Electrically Programmable ROM (EPROM), Electrically Erasable Programmable ROM (EEPROM), registers, hard disk, a removable disk, a CD ROM, or any other suitable form of storage medium.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of performing a structure data operation, comprising:
   providing input data including a processing structure and an input solid structure including a plurality of solid units;
   converting the input solid structure to an input boundary surface structure including attribute information on input boundary surfaces of the plurality of solid units;
   performing a structure data operation on the input boundary surface structure to generate an output boundary surface structure, the structure data operation including applying the processing structure to the input boundary surface structure; and providing output data based on the output boundary surface structure.

2. The method as claimed in claim 1, wherein converting the input solid structure to the input boundary surface structure includes allocating material attribute to each of the input boundary surfaces of the plurality of solid units, the material attribute indicating two adjacent solid units at both sides of each of the input boundary surfaces.

3. The method as claimed in claim 1, wherein converting the input solid structure to the input boundary surface structure further includes:
dividing each of the input boundary surfaces having the same material attribute into sub input boundary surfaces; and
allocating region attribute to each of the sub input boundary surfaces.

4. The method as claimed in claim 1, wherein:
the processing structure corresponds to an etching surface, and
the structure data operation corresponds to an etching process to remove materials of the input solid structure according to the etching surface.

5. The method as claimed in claim 4, wherein performing the structure data operation includes:
providing a residual boundary surface structure including residual boundary surfaces corresponding to first portions of the input boundary surfaces that remain after second portions of the input boundary surfaces are removed according to the etching surface;
providing valid etching surfaces corresponding to portions of the etching surface that are etched, the valid etching surfaces being divided by etched solid units;
providing an operation boundary surface structure by allocating the attribute information to the valid etching surfaces; and
providing the output boundary surface structure by combining the residual boundary surface structure and the operation boundary surface structure.

6. The method as claimed in claim 5, wherein performing the structure data operation further includes classifying the input boundary surfaces as an etching permission input boundary surface that is etched by the etching process or an etching inhibition input boundary surface that is not etched by the etching process.

7. The method as claimed in claim 6, wherein providing the residual boundary surface structure includes:
providing an etching inhibition cross surface corresponding to a portion of the etching inhibition input boundary surface that is divided by the etching surface; and
allocating the attribute information to the etching inhibition cross surface, and wherein
the etching inhibition cross surface is included in the output boundary surface structure.

8. The method as claimed in claim 7, wherein providing the valid etching surfaces includes:
providing an invalid etching surface corresponding to a portion of the etching surface that is disposed under the etching inhibition cross surface; and
providing the valid etching surfaces by removing the invalid etching surface from the etching surface.

9. The method as claimed in claim 1, further comprising removing edges shorter than a reference value among edges of boundary lines of output boundary surfaces of the output boundary surface structure.

10. The method as claimed in claim 1, wherein proving the output data includes providing data corresponding to the output boundary surface structure as the output data.

11. The method as claimed in claim 1, wherein proving the output data includes:
converting the output boundary surface structure to an output solid structure; and
providing data corresponding to the output solid structure as the output data.

12. The method as claimed in claim 1, wherein:
the processing structure corresponds to a planarization surface, and
the structure data operation corresponds to a planarization process to remove materials of the input solid structure according to the planarization surface.

13. The method as claimed in claim 1, wherein:
the processing structure corresponds to a deposition surface, and
the structure data operation corresponds to a deposition process to dispose deposition material on materials of the input solid structure according to the deposition surface.

14. The method as claimed in claim 13, wherein providing the output boundary surface structure includes:
providing deposition hidden boundary surfaces corresponding to portions of an uppermost input boundary surface among the input boundary surfaces that are disposed under the deposition surface and deposition exposed boundary surfaces corresponding to portions of an uppermost input boundary surface that are disposed above the deposition surface;
providing valid deposition surfaces corresponding to portions of the deposition surface that remain after portions of the deposition surface under the deposition exposed boundary surfaces are removed; and
allocating the attribute information to the deposition exposed boundary surfaces and the valid deposition surfaces.

15. The method as claimed in claim 14, wherein allocating the attribute information to the deposition exposed boundary surfaces and the valid deposition surfaces includes:
updating the attribute information of the deposition hidden boundary surfaces before the deposition process, based on the deposition material; and
maintaining the attribute information of the deposition exposed boundary surfaces before the deposition process.

16. The method as claimed in claim 15, wherein providing the output boundary surface structure further includes maintaining attribute information of a lower input boundary surfaces among the input boundary surfaces except the uppermost input boundary surface before the deposition process.

17. The method as claimed in claim 1, wherein converting the input solid structure to the input boundary surface structure includes providing a bounding box that defines a volume unit for performing the structure data operation among the input solid structure, and wherein
the input boundary surfaces for performing the structure data operation are included in the bounding box.

18. The method as claimed in claim 1, further comprising:
performing a smoothing data operation to remove noise components corresponding to structural errors among structure elements of the input solid structure based on surface energy minimization using following expressions, $$T = \left(\frac{\alpha}{V_1 \cdot \mathrm{Min}(diA1)}\right)^{(1+N_1)} + \left(\frac{\alpha}{V_2 \cdot \mathrm{Min}(diA2)}\right)^{(1+N_2)}$$

-continued $$E = \frac{T}{2}\|s_0 \times s_1\|$$

where T is a surface tension of each surface, α is a constant, V1 and V2 are volume units of two bodies including each surface, N1 and N2 are numbers of edges having three or more surfaces shared by each edge of the two bodies, diA1 and diA2 are minimum surface angles among surface angles of the two bodies, S0 and S1 are two vectors connecting vertexes of each surface, and E is surface energy.

19. A computer-based electronic system, comprising:
an input device to receive input data including a processing structure and an input solid structure including a plurality of solid units; and
a processor to convert the input solid structure to an input boundary surface structure including attribute information on input boundary surfaces of the plurality of solid units, wherein:
the processor is configured to perform a structure data operation to generate an output boundary surface structure, the structure data operation including applying the processing structure to the input boundary surface structure.

20. A computer-based electronic system, comprising:
an input device to receive input data including a processing structure and an input solid structure including a plurality of solid units;
a memory device to store information including program routines, the program routines to convert the input solid structure to an input boundary surface structure including attribute information on input boundary surfaces of the plurality of solid units and perform a structure data operation to generate an output boundary surface structure, the structure data operation including applying the processing structure to the input boundary surface structure;
an output device to display the input solid structure and an output solid structure corresponding to the output boundary surface structure; and
a processor connected to the input device, the output device and the memory device, the processor to control the program routines.

* * * * *